United States Patent
Shiramizu et al.

(10) Patent No.: US 7,592,877 B2
(45) Date of Patent: Sep. 22, 2009

(54) VARIABLE FREQUENCY OSCILLATOR AND COMMUNICATION CIRCUIT WITH IT

(75) Inventors: Nobuhiro Shiramizu, Musashino (JP); Toru Masuda, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/771,403

(22) Filed: Jun. 29, 2007

(65) Prior Publication Data

US 2008/0122546 A1 May 29, 2008

(30) Foreign Application Priority Data

Jul. 4, 2006 (JP) .............................. 2006-184361

(51) Int. Cl.
*H03B 5/24* (2006.01)

(52) U.S. Cl. ........................ 331/57; 331/34; 331/177 R; 331/185

(58) Field of Classification Search ................. 331/1 R, 331/10, 11, 16, 25, 34, 44, 57, 177 R, 179, 331/182, 183, 185, 186; 327/156–157; 375/373–376
See application file for complete search history.

(56) References Cited

U.S. PATENT DOCUMENTS

| | | | | |
|---|---|---|---|---|
| 5,061,907 A | * | 10/1991 | Rasmussen | 331/57 |
| 5,331,295 A | * | 7/1994 | Jelinek et al. | 331/57 |
| 5,416,446 A | * | 5/1995 | Holler et al. | 331/57 |
| 5,691,669 A | * | 11/1997 | Tsai et al. | 331/17 |
| 5,952,892 A | * | 9/1999 | Szajda | 331/57 |
| 6,011,444 A | * | 1/2000 | Takada et al. | 331/57 |
| 6,072,372 A | * | 6/2000 | Yokoyama | 331/57 |
| 6,215,364 B1 | | 4/2001 | Hwang et al. | |
| 6,731,558 B2 | | 5/2004 | Yamauchi et al. | |
| 6,756,853 B2 | * | 6/2004 | Schmitt et al. | 331/57 |
| 6,825,731 B2 | | 11/2004 | Hasegawa | |
| 6,901,126 B1 | * | 5/2005 | Gu | 375/355 |
| 2002/0140504 A1 | * | 10/2002 | Hasegawa | 330/57 |
| 2005/0088247 A1 | | 4/2005 | Yasui | |
| 2005/0258911 A1 | | 11/2005 | Higuchi et al. | |

FOREIGN PATENT DOCUMENTS

| | | |
|---|---|---|
| JP | 11-298302 A | 10/1999 |
| JP | 2001-358565 A | 12/2001 |

(Continued)

OTHER PUBLICATIONS

Ali Hajimiri and Thomas H. Lee "The Design of Low Noise Oscillators", Kluwer Academic Publishers, 1999, p. 169.

*Primary Examiner*—Reford N Barnie
*Assistant Examiner*—Jany Tran
(74) *Attorney, Agent, or Firm*—Miles & Stockbridge P.C.

(57) ABSTRACT

In a variable frequency oscillator in a semiconductor device, as the variation of an oscillation frequency caused by the variation of temperature and supply voltage and process variation is large, it is difficult to reduce the conversion ratio of control voltage dependent upon phase noise and the oscillation frequency and therefore, phase noise is large. The variation of the oscillation frequency is suppressed and phase noise is reduced by connecting a voltage-to-current conversion circuit that converts input control voltage to control current of a ring oscillator to the ring oscillator where delay circuits a delay time of which increases and decreases according to the amplitude of input control current are cascade-connected by a plurality of stages in a ring and increasing/decreasing current dependent upon any of temperature, supply voltage and the threshold voltage of a transistor inside the voltage-to-current conversion circuit.

6 Claims, 20 Drawing Sheets

FOREIGN PATENT DOCUMENTS

| | | |
|---|---|---|
| JP | 2002-290212 A | 10/2002 |
| JP | 2003-132676 A | 5/2003 |
| JP | 2003-283305 A | 10/2003 |
| JP | 2005-130092 A | 5/2005 |
| JP | 2005-333484 A | 12/2005 |

* cited by examiner

- ● ○ MOS PARAMETER: SLOWEST, SUPPLY VOLTAGE 1.08V, TEMPERATURE 110°C
- ■ □ MOS PARAMETER: TYPICAL, SUPPLY VOLTAGE 1.20V, TEMPERATURE 65°C
- ▲ △ MOS PARAMETER: FASTEST, SUPPLY VOLTAGE 1.32V, TEMPERATURE 25°C

THE GATE WIDTH WCS OF THE TRANSISTOR 36 FOR VOLTEGE-TO-CURRENT CONVERSION IS 4.8mm
PN: THE PHASE NOISE AT THE OFFSET FREQUENCY OF 1MHz

Prior Art

Prior Art

Prior Art ically changed according to an output signal of a phase frequency detector is disclosed. In this case, a characteristic of a frequency to control voltage can be linearized. However, as no configuration for the reduction of the variation of a frequency due to temperature, process and a power supply and no method of controlling KVCO are disclosed, it is difficult to acquire a desired frequency on any condition in a range of specifications.

VARIABLE FREQUENCY OSCILLATOR AND COMMUNICATION CIRCUIT WITH IT

CLAIM OF PRIORITY

The present application claims priority from Japanese application JP 2006-184361 filed on Jul. 4, 2006, the content of which is hereby incorporated by reference into this application.

FIELD OF THE INVENTION

The present invention relates to a variable frequency oscillator and a communication circuit with it, particularly relates to a voltage controlled oscillator that generates a high-frequency low-noise clock signal in wire communication and radio communication and a communication circuit with it.

BACKGROUND OF THE INVENTION

In a communication circuit for transmitting a digital signal, a clock signal to be a reference of timing to synchronize internal circuits and communication circuits is used and a circuit for generating a clock signal of a frequency according to a transmission rate is required. Recently, a serial transmission system suitable for the enhancement of a transmission rate is often used. And many serializer/deserializer (SER-DES) circuits that convert parallel signals to high speed serial signals for transmitting the signals using time division multiplexing method are used.

An example in which a ring oscillator is used for a phase locked loop (PLL) that generates a clock signal in a microprocessor and a digital signal communication circuit is disclosed in JP-A-1999-298302 and JP-A-2001-358565. For a countermeasure for the frequency variation of PLL, methods to suppress frequency variation due to ambient temperature, process variation and supply voltage are disclosed in JP-A-2003-283305, JP-A-2005-333484; JP-A-2002-290212, JP-A-2005-130092 and JP-A-2003-132676.

SUMMARY OF THE INVENTION

In the case of a serial transmission system, as time length per code is reduced according to the enhancement of a signal transmission rate, the reduction of jitter which is the variation of timing of a clock signal is demanded. The jitter of a clock signal correlates with phase noise caused by a voltage controlled oscillator of PLL and can be reduced by reducing the phase noise of the oscillator. The phase noise means the variation of a phase of an oscillation signal caused due to the thermal noise and the flicker noise of elements configuring the oscillator. For a voltage controlled oscillator that realizes the reduction of phase noise, an LC oscillator including an inductor, a variable capacitor and a transistor is known. However, as an inductor the parasitic series resistance of which is small is required in the LC oscillator the phase noise of which is small, relatively large area and an additional manufacturing process for thick film wiring structure and others are required when the LC oscillator is configured as a semiconductor integrated circuit. Therefore, the LC oscillator is often used for radio communication in which requirements for phase noise are strict.

In the meantime, as a ring oscillator configured by cascade-connecting delay circuits in which a delay time varies depending upon input voltage and current in a ring can be configured by only transistors without using a passive component, the ring oscillator is often used for PLL that generates a clock signal in a microprocessor and a digital signal communication circuit. However, compared with the LC oscillator, phase noise is generally large for the same oscillation frequency in the ring oscillator.

Therefore, as a rate of a communication circuit is enhanced, the reduction of phase noise of the ring oscillator having small area and requiring no additional manufacturing process is intensely demanded.

In the conventional ring oscillator disclosed in JP-A-1999-298302, four-stage delay circuits 130 are cascade-connected as shown in FIG. 21 and a differential signal output terminal of the delay circuit 130d at a fourth stage is connected to a differential signal input terminal of the delay circuit 130a at a first stage in an inverted state. A delay time varies depending upon a control voltage input terminal Vcont of the delay circuit. The delay circuit 130 shown in FIG. 21 uses complementary amplifier circuits 132 to 139 for an amplifier circuit as shown in FIG. 22 and the complementary amplifier circuits include differential amplifier circuits 132, 135, 136, 139 and positive feedback circuits 133, 134, 137, 138. In addition, a current control transistor 140 varies current of the delay circuit according to control voltage Vcont and controls a delay time of the delay circuit. This circuit configuration can realize a variable frequency oscillator that can oscillate a high frequency at low supply voltage. Therefore, the circuit configuration is suitable for the reduction of power consumption and being built in LSI low in breakdown voltage and using a high speed scaled CMOS process.

However, in the case of the conventional configuration, current flowing in the delay circuit varies due to the variation of a threshold of the transistor and the variation of supply voltage by the variation of ambient temperature and process variation and large frequency variation is caused. In that case, in the conventional circuit configuration, a frequency is required to be fixed utilizing a frequency follow-up characteristic of PLL. That is, the variation of a frequency is detected by a phase frequency detector and control voltage is varied.

Therefore, an oscillation frequency range of the variable frequency oscillator is required to be determined so that frequency variation by the variation of ambient temperature, process variation and the variation of supply voltage is within a control range of an oscillation frequency and a desired frequency is acquired on any condition in a range of specifications. As a control voltage range of the variable frequency oscillator is limited by supply voltage, the conversion ratio KVCO of control voltage and a frequency is required to be set to as a large value as possible so that the oscillation frequency range is extended.

Particularly, when the scaled CMOS process operated at a high frequency and low in withstand voltage is used in manufacturing LSI for high speed serial communication, a fall of supply voltage cannot be avoided, in a conventional method, the reduction of KVCO is limited, and it is difficult to suppress the deterioration of phase noise in this circuit type.

In circuit configuration disclosed in JP-A-2003-283305, a constant current source not depending upon temperature is provided, current flowing in an inverter is controlled, and frequency variation is suppressed. Besides, in JP-A-2005-333484, a method to suppress the variation of a frequency by the variation of threshold voltage is disclosed. However, as no method for frequency control to acquire desired KVCO is disclosed in JP-A-2003-283305 and JP-A-2005-333484, it is difficult to configure a variable frequency oscillator hardly having phase noise in that state.

In addition, in JP-A-2002-290212, a voltage controlled oscillator configured so that current of each delay circuit formed by a differential inverting amplifier circuit is current acquired by adding current Icn1 according to constant voltage Vcn1 and current Icnt according to control voltage Vcnt is disclosed. As the differential amplifier circuit is required to be used, the extension of an oscillation frequency range and a fall of voltage are limited, compared with configuration using the complementary amplifier circuit shown in the conventional circuit. Further, in the case of a method of applying current Icn1 according to fixed voltage to only a current source on the either side and suppressing variation, which is disclosed as a second example in JP-A-2002-290212, current under control voltage on the other side varies due to the variation of temperature, the variation of a manufacturing characteristic and the variation of supply voltage and a compensable range of frequency variation may be limited.

In JP-A-2005-130092, a common current source is controlled to compensate the variation of supply voltage. Further, in JP-A-2003-132676, configuration for reducing a refresh cycle for temperature compensation when temperature rises is disclosed.

However, in any method, when the scaled CMOS process is adopted, environmental variation cannot be sufficiently compensated suppressing the deterioration of phase noise at a high oscillation frequency. Referring to the following drawings, this point will be described below.

First, FIGS. 23A and 23B show relation among frequency control voltage VCNT, an output frequency f, the variation of temperature, process variation and the variation of supply voltage which are respectively causes of environmental variation. When the conversion ratio (the conversion gain) KVCO of control voltage VCNT and a frequency is large, a desired fixed output frequency can be acquired by control voltage VAD-A in a predetermined range as shown in FIG. 23A. However, as shown in FIG. 23B, when the conversion gain KVCO is small and when the variation of temperature and process variation occur, a desired fixed output frequency cannot be acquired even in a large range of control voltage VAD-B.

In the meantime, phase noise correlates with KVCO and the larger KVCO is, the larger phase noise is. Referring to a mathematical expression 1 and FIGS. 24, relation between phase noise and conversion gain KVCO will be described below. First, phase noise and its dependency upon a frequency are expressed as a model when only thermal noise causes phase noise in an expression E.14 in a non-patent document 2 as shown in the following expression.

$$S_{\phi_{OUT}}(\omega) = \left|\frac{K_{VCO}}{j\omega}\right|^2 \quad \text{[Mathematical expression 1]}$$

$$S_n(\omega) = \frac{K_{VCO}^2 N_0/2}{\omega^2}$$

However, $\omega$ denotes an offset frequency, $S\Phi OUT$ denotes output phase noise, Sn denotes the equivalent input phase noise of VCO, and N0/2 denotes double sideband power spectral density of white noise of VCO.

This expression shows that the smaller KVCO is, the more phase noise decreases.

That is, as shown in FIG. 24B, when conversion gain KVCO is large, phase noise is also large and as shown in FIG. 24C, when conversion gain KVCO is small, phase noise is also small. Therefore, to reduce phase noise, conversion gain KVCO is required to be reduced.

However, as described above, when conversion gain KVCO is small, a desired rated output frequency cannot be acquired in a control voltage range because of the variation of temperature and process variation.

As described above, the variation of temperature and supply voltage and process variation and phase noise are located in the relation of trade-off.

That is, in the variable frequency oscillator in a semiconductor device, when the conversion ratio of control voltage and an oscillation frequency is reduced because oscillation frequency variation caused by the variation of temperature and supply voltage and process variation is large, a controllable oscillation frequency range is narrowed and a desired oscillation frequency may be not acquired because of the variation of the oscillation frequency. Therefore, it is difficult to reduce the conversion ratio of control voltage dependent upon phase noise and the oscillation frequency.

Particularly, as for a high oscillation frequency used for PLL built in LSI for high speed serial communication, for example, 1.0 GHz or more, the variation of temperature and supply voltage, process variation and phase noise are located in the relation of trade-off, it is difficult to reduce the conversion ratio of control voltage and the oscillation frequency suppressing the variation of the oscillation frequency and to acquire a desired oscillation frequency.

Then, one object of the invention is to provide a variable frequency oscillator in which the conversion ratio of control voltage and an oscillation frequency is reduced suppressing the variation of the oscillation frequency and a desired oscillation frequency can be acquired at small phase noise and a communication circuit with it.

A typical one example of the invention is as follows. That is, a variable frequency oscillator according to the invention is provided with a power source, a ring oscillator in which delay circuits of plural stages are cascade-connected in a ring and which outputs an oscillation signal of a frequency according to control current and a current source for frequency control that supplies the control current to the ring oscillator. The current source for frequency control of the ring oscillator includes a first current source and a second current source respectively connected to the ring oscillator via a common terminal, the first current source generates current for frequency control according to input voltage for frequency control, the second current source generates current for compensation according to environmental variation, and the current for frequency control and the current for compensation are added to be control current of the ring oscillator.

According to the invention, as the environment variation of the variable frequency oscillator can be compensated when a desired oscillation frequency is acquired, the conversion ratio of voltage and a frequency is reduced and phase noise can be reduced.

DETAILED DESCRIPTION OF THE PREFERRED EMBODIMENTS

Figure 1:
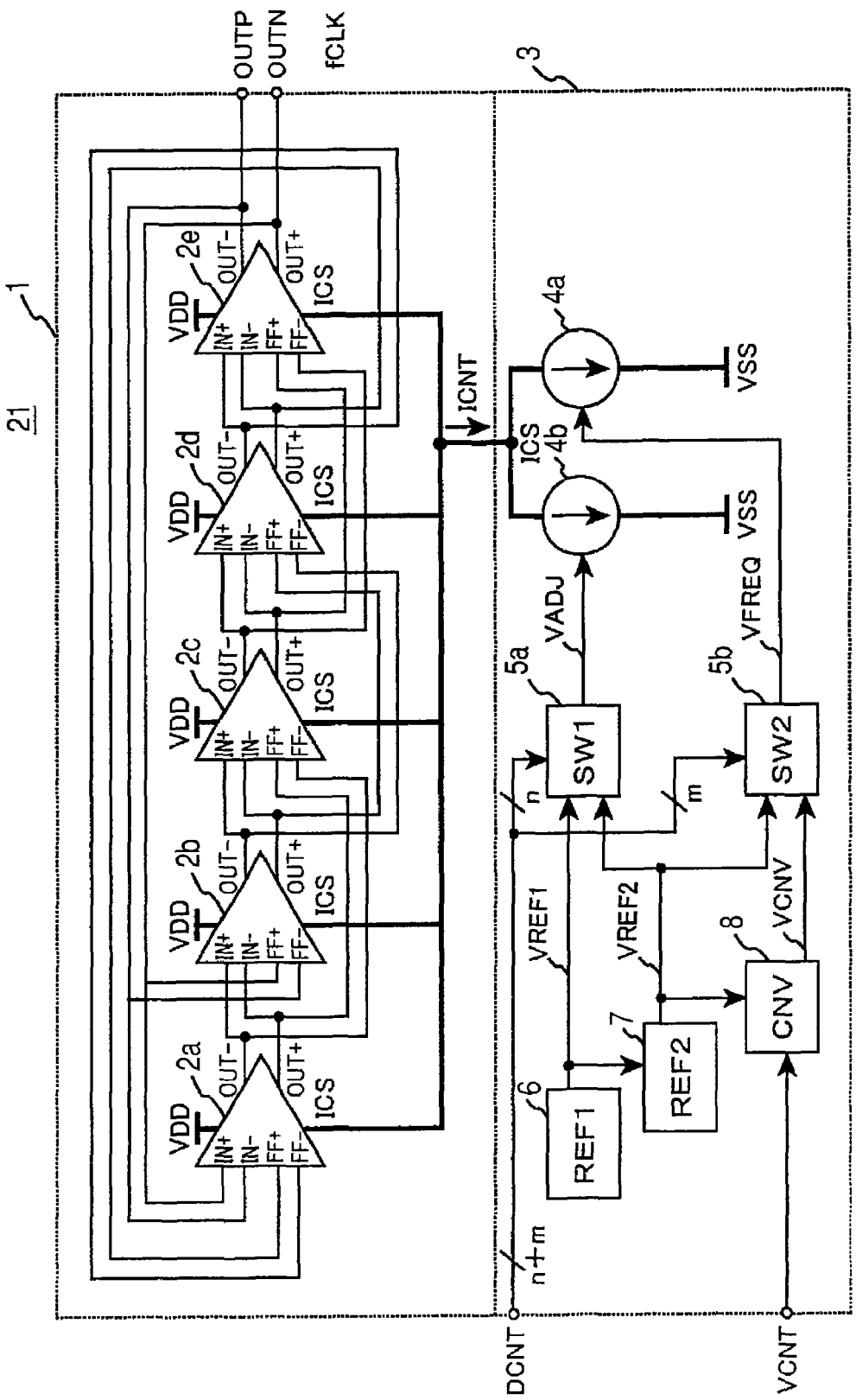
FIG. 1 is a block diagram showing a variable frequency oscillator equivalent to a first embodiment of the invention.

Referring to the drawings, embodiments of the invention will be described more detailedly below.

First Embodiment

Referring to FIGS. 1 to 5, a first embodiment of a variable frequency oscillator according to the invention will be described below.

Figure 2:
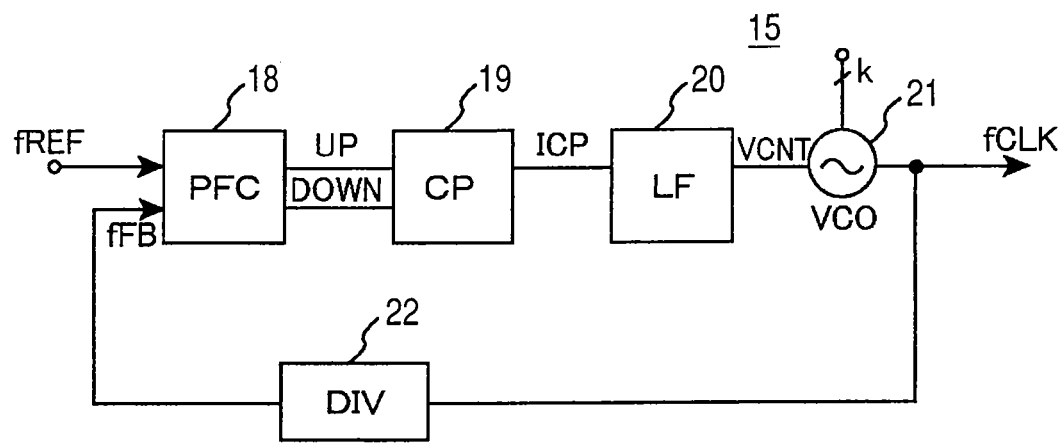
FIG. 2 is a block diagram showing an embodiment of PLL using the variable frequency oscillator equivalent to the first embodiment and shown in FIG. 1.

First, FIG. 2 shows an example of the configuration of PLL in which the variable frequency oscillator according to the invention is used. The PLL 15 includes a phase frequency detector (PFC) 18, a charge pump (CP) 19, a loop filter (LF) 20, a voltage controlled oscillator (VCO) 21 and a divider (DIV) 22. The phase frequency detector (PFC) 18 compares phase difference between a reference clock signal of a frequency fREF and a feedback clock signal fFB acquired by dividing an output signal by the divider and outputs an up pulse when the feedback signal lags the reference clock signal or a down pulse when the feedback signal leads. The charge pump 19 outputs current ICP according to the input up or down signal and charges or discharges the capacity of the loop filter 20. An output terminal of the loop filter 20 is connected to an input terminal of the variable frequency oscillator according to the invention, that is, the voltage controlled oscillator (VCO) 21 and a frequency fCLK of an output clock is controlled according to potential VCNT determined according to the output ICP of the charge pump 19 and a transfer characteristic of the filter 20. An output signal from the voltage controlled oscillator 21 is divided by N by the divider 22 and is fed back to the phase frequency detector 18. A frequency fREF of an output clock signal is controlled by forming a feedback loop so that the phase difference between the reference clock signal fREF and the feedback clock signal fFB approximates zero and the PLL 15 can generate N(integer)-fold clock signal synchronized with the reference clock signal.

FIG. 1 is a block diagram showing the first embodiment of the variable frequency oscillator according to the invention. The variable frequency oscillator 21 is configured by a current controlled ring oscillator 1 and a voltage-to-current conversion circuit 3.

In the current controlled ring oscillator 1, plural current controlled delay circuits 2 (2a to 2e) which are configured by only plural transistors and in which a delay time varies according to input voltage and current (ICNT) are cascade-connected in a ring, each of these plural current controlled delay circuits is connected to a power supply terminal VDD for connecting to an external power supply in common, and the current controlled ring oscillator is provided with output terminals OUTP and OUTN. The voltage-to-current conversion circuit 3 includes first and second voltage controlled current source circuits 4 (4a, 4b), first and second voltage select switch circuits 5 (5a, 5b), a reference voltage source circuit (REF1) 6 which is a first circuit for process, voltage and temperature environment compensation, a reference voltage conversion circuit (REF2) 7 which is a second circuit for process, voltage and temperature environment compensation and a voltage conversion circuit for frequency control (CNV) 8. A terminal common to the two voltage controlled current source circuits 4 and each one terminal ICS of the plural current controlled delay circuits 2 configuring the current controlled ring oscillator 1 are connected in common. Each other terminal of the plural current controlled delay circuits is connected to the power supply terminal VDD for connecting to the external power supply in common.

Offset voltage VOFFSET for process, voltage and temperature environment compensation corresponding to output VREF2 is added to frequency control voltage VCNT input to the voltage-to-current conversion circuit 3 from an external device in the voltage conversion circuit for frequency control 8 to be first reference output voltage VCNV. The first reference output voltage VCNV is input to the second voltage select switch circuit 5b controlled by a control signal DCNT together with the output VREF2 of the reference voltage conversion circuit (REF2) 7, are converted to first reference voltage VFREQ, and further, are converted to first current (Ia) in the first voltage controlled current source circuit 4a.

In the meantime, output VREF1 of the first reference voltage source circuit (REF1) 6 for process, voltage and temperature environment compensation and the output VREF2 of the second reference voltage conversion circuit (REF2) 7 for process, voltage and temperature environment compensation are input to the first voltage select switch circuit 5a controlled by the control signal DCNT, are converted to second reference voltage VADJ, and further, are converted to second current (Ib) in the second voltage controlled current source circuit 4b.

The two currents Ia, Ib are added at the common terminal ICS of the first and second voltage controlled current source circuits 4a, 4b and are input to the current controlled ring oscillator 1 connected to the terminal ICS as control current ICNT.

As described above, the voltage-to-current conversion circuit 3 according to the invention is configured by a first current source for generating current for frequency control of the ring oscillator 1 corresponding to the frequency control voltage VCNT input from the external device and a second current source that adds or subtracts current for process, voltage and temperature environment compensation to/from the current for frequency control. The first current source and the second current source are integrated in the voltage-to-current conversion circuit 3 as circuitry. The first current source at least includes the voltage conversion circuit for frequency control (CNV) 8 and the first voltage controlled current source circuit 4a. The second current source at least includes the reference voltage source circuit (REF1) 6 for process, voltage and temperature environment compensation, the reference voltage conversion circuit (REF2) 7 and the second voltage controlled current source circuit 4b.

The current controlled ring oscillator 1 includes the N-stage delay circuits of delay time tpd proportional to the current ICNT, a feedback signal from an N-th-stage output terminal to a first-stage input terminal is positive feedback, and the current controlled ring oscillator is oscillated when an oscillation frequency f0=1/tpd/N. Therefore, oscillation frequencies fCLK output from OUTP and OUTN of the current controlled ring oscillator 1 can be varied by varying VCNT so that the current ICNT is controlled. The current controlled delay circuit 2 is configured by a metal oxide semiconductor (MOS) transistor and the current controlled ring oscillator 1 is manufactured in a digital process.

FIG. 1 shows a case that N=5 as an example, however, the invention is not limited to five stages.

Next, an example of the configuration of SERDES adopting the voltage controlled oscillator 21 equivalent to this embodiment of the invention will be described referring to FIG. 3. The SERDES 9 is provided with a parallel-to-serial converter 10 that converts a parallel input signal to a serial signal, a serial signal output circuit 11, a serial signal input circuit 12, clock data recovery (CDR) 13 for reproducing a clock signal synchronized with a received signal, a serial-to-parallel converter 14 that generates a parallel output signal, the phase locked loop (PLL) 15 and a PLL oscillation frequency select switch circuit (CTRL) 16.

The PLL oscillation frequency select switch circuit (CTRL) 16 detects phase difference between external data acquired from a terminal connected to an external device EXTENT and the PLL 15 and generates a control signal DCNT based upon the phase difference.

When a reference clock signal of a frequency fREF output from a reference clock generator 17 using a crystal oscillator and others outside a communication circuit is input to the SERDES 9, the PLL 15 generates a clock signal of an N(integer)-fold frequency fCLK at a phase synchronized with the reference signal and controlled by the control signal DCNT. This clock signal is utilized in each circuit of the parallel-to-serial converter 10, the serial-to-parallel converter 14, the output circuit 11, the input circuit 12 and the CDR 13 to synchronize with a data signal.

Referring to FIG. 1 again, the configuration and the action of the variable frequency oscillator 21 will be described in detail below. Each current controlled delay circuit 2a to 2e in the current controlled ring oscillator 1 is provided with second differential signal input terminals FF+, FF− in addition to first differential signal input terminals IN+, IN−. The following output signals are transmitted previous to signals input to IN+, IN− of the next stage after the next stage via output signals of the next stage by the delay time of the delay circuit by inputting certain-stage output signals OUT+, OUT− to FF+, FF− of the next stage after the next stage. Delay time per one stage of each current controlled delay circuit can be reduced by applying these feedforward signals and at the time of the same current ICNT, an oscillation frequency fCLK can be increased. In the meantime, compared with a case of the same oscillation frequency, the time of state transition in which the delay circuit modulates the noise of control current to phase noise is reduced by reducing the rise time and the fall time of the delay circuit and it contributes to the reduction of phase noise.

Figure 4A:
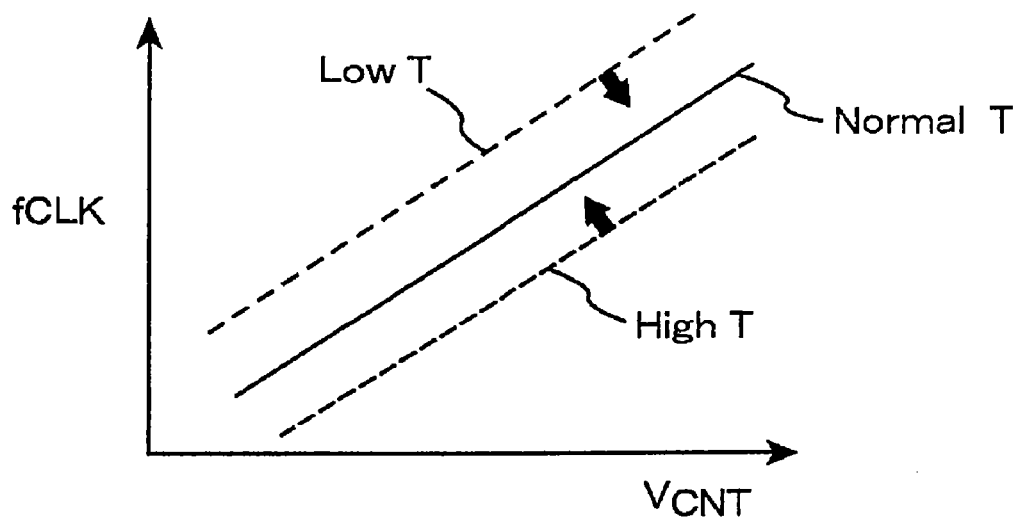
FIGS. 4 are explanatory drawings for explaining the operation of a reference voltage source circuit shown in FIG. 1.

FIG. 4A shows relation among frequency control voltage VCNT, an oscillation frequency fCLK and ambient temperature T. When ambient temperature T is high (High T), current I ($\propto$VTH) supplied to the voltage controlled current source circuits 4a, 4b increases and the delay time of each current controlled delay circuit in the current controlled ring oscillator 1 is increased. Therefore, when the ambient temperature T is high, the frequency control voltage VCNT decreases and the oscillation frequency fCLK decreases, compared with a case of a normal temperature range. Conversely, when the ambient temperature T is low (Low T), the oscillation frequency fCLK increases.

Figure 4B:
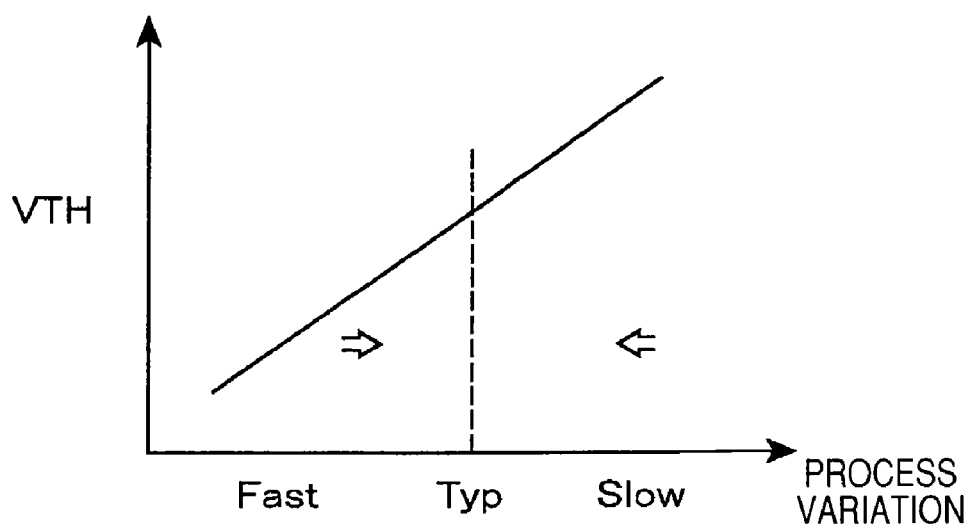

FIG. 4B shows relation between the dimension caused by process variation of the threshold voltage of the MOS transistor and an oscillation frequency Fcok. When the process variation is large (Fast or Slow), the threshold voltage VTH is off from a designed value (Typ).

The reference voltage source circuit (REF1) 6 and the reference voltage conversion circuit (REF2) 7 respectively for process, voltage and temperature environment compensation in this embodiment of the invention are provided with a function for compensating the variation of the ambient temperature T, the variation of supply voltage or the variation due to the process variation of MOS of the oscillation frequency, in other words, are provided with the function for measuring characteristics of the variable frequency oscillator 21 in a process for manufacturing the variable frequency oscillator or the radio communication circuit, adjusting them in directions shown by arrows in FIGS. 4A and 4B according to the ambient temperature and others and correcting them to be rated characteristics (Normal, Typ). For example, when input voltage to the current source circuits 4a, 4b is the same, output current ICNT decreases according to the rise of temperature and the increase of the threshold voltage, however, the variation of the output current ICNT can be suppressed by adding VADJ and VFREQ that vary depending upon reference voltage VREF1, VREF2 generated in (REF1) 6 and (REF2) 7.

That is, the reference voltage source circuit 6 increases output difference voltage VREF1 with reference potential when temperature T rises and the threshold voltage VTH of the MOS transistor increases. The reference voltage source circuit also outputs fixed voltage when supply voltage varies. The reference voltage conversion circuit 7 outputs voltage VREF2 acquired by switching the reference potential of the output difference voltage from power supply voltage to grounding voltage or reversely switching. The frequency control voltage VCNT input from the external device is input to the voltage conversion circuit for frequency control 8, fixed offset voltage VOFFSET depending upon the reference voltage VREF2 is added, an increasing rate of voltage is converted, and is output as VCNV.

The offset voltage VOFFSET varies according to ambient temperature and the threshold voltage VTH of the MOS transistor.

The variable frequency oscillator 21 can be initialized to voltage-to-frequency conversion ratio of a small rate of a change in a small specified range with a desired oscillation frequency fCLK in the center owing to the adjusting function of the voltage-to-current conversion circuit 3 provided with the reference voltage source circuit 6 and the reference voltage conversion circuit 7 independent of ambient temperature T, supply voltage or process variation.

The voltage VREF1 of the reference voltage source circuit 6, VREF2, VCNV are input to the voltage select switch circuits 5a or 5b. The voltage select switch circuits 5a, 5b can greatly vary control voltage according to an internal or external logic signal. That is, the voltage select switch circuits can switch to a frequency exceeding a range of external control voltage VCNT.

In the meantime, as small voltage-to-frequency conversion ratio KVCO can be realized, phase noise can be reduced. As voltage is switched by a MOS switch inside the voltage select switch circuits 5a, 5b, the noise of control voltage hardly increases.

The output voltage VADJ of the voltage select switch circuit 5a and the output voltage VFREQ of the voltage select switch circuit 5b are input to the voltage controlled current source circuits 4a, 4b. The voltages VADJ, VFREQ are converted to currents by the voltage controlled current source circuits 4a, 4b, the two currents are added at the terminal ICS connected in common, and control current ICNT is output.

When the same voltage is input to the current source circuits 4a, 4b, the output current ICNT decreases according to the rise of temperature and the increase of the threshold voltage, however, the variation of ICNT can be suppressed by adding VADJ and VFREQ that vary depending upon the reference voltage VREF1. The dependency of ICNT upon supply voltage can be reduced by reducing the dependency of the reference voltages VREF1, VADJ, VFREQ upon supply voltage.

Figure 5:
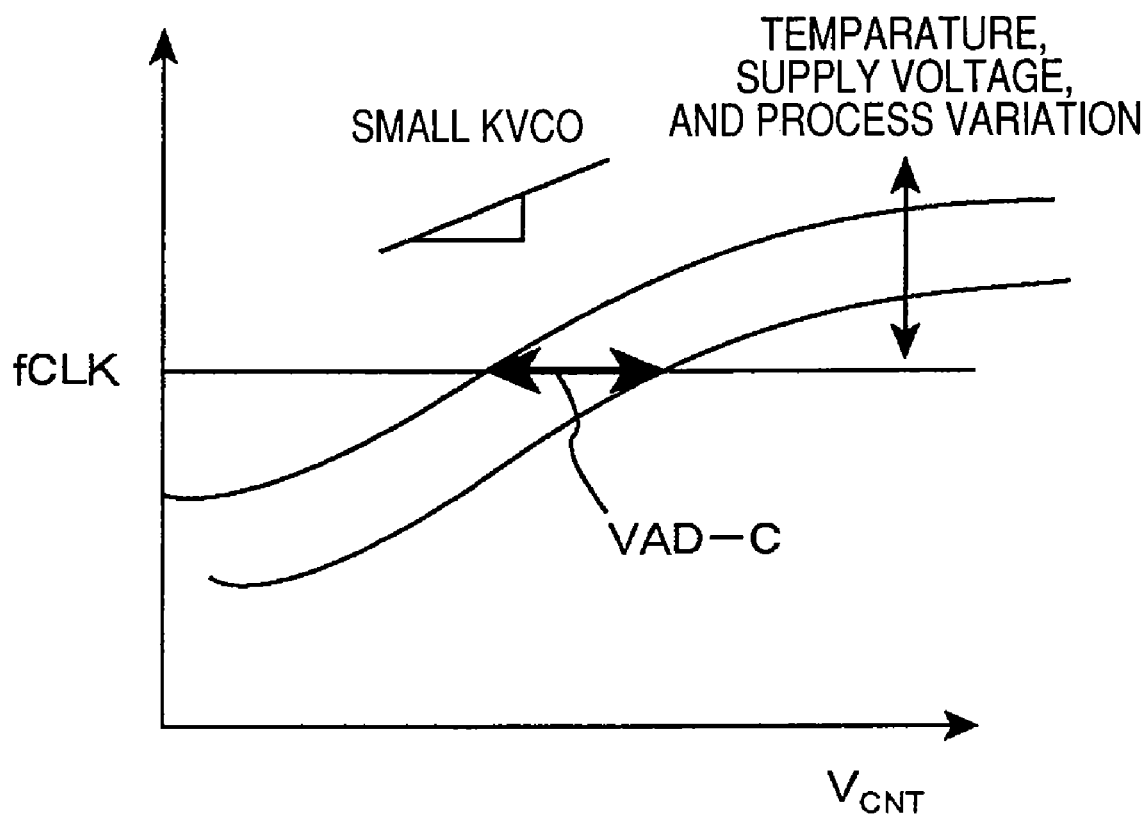
FIG. 5 is an explanatory drawing for explaining the effect of frequency conversion in the first embodiment and shown in FIG. 1.
Figure 23A:
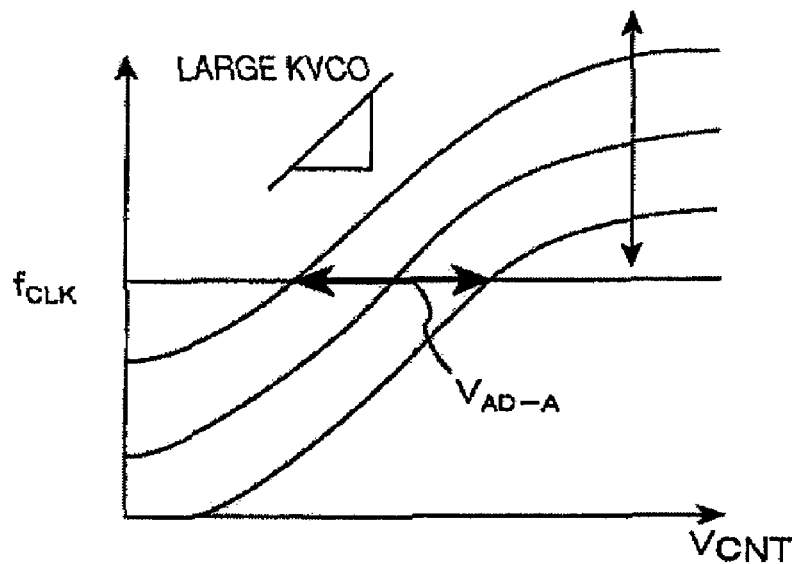
FIG. 23A shows relation between voltage-to-frequency conversion gain KVCO and environmental variation and FIG. 23B shows relation between voltage-to-frequency conversion gain KVCO and environmental variation.
Figure 23B:
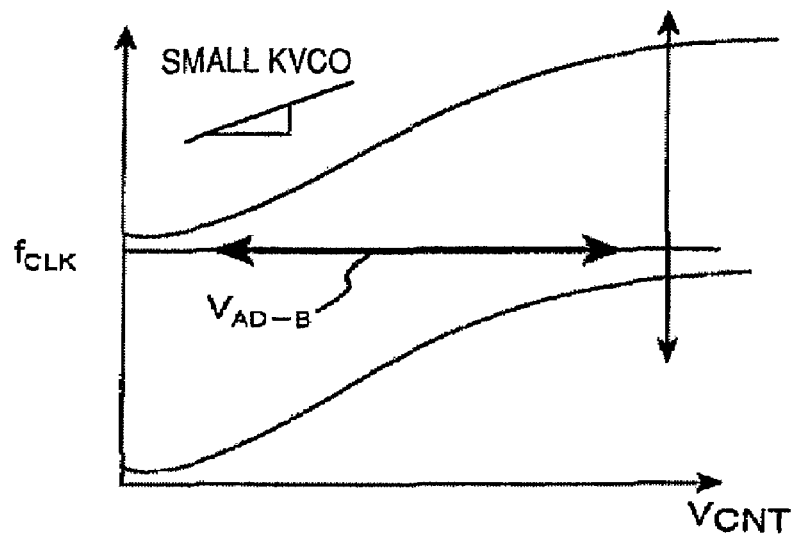
Figure 24A:
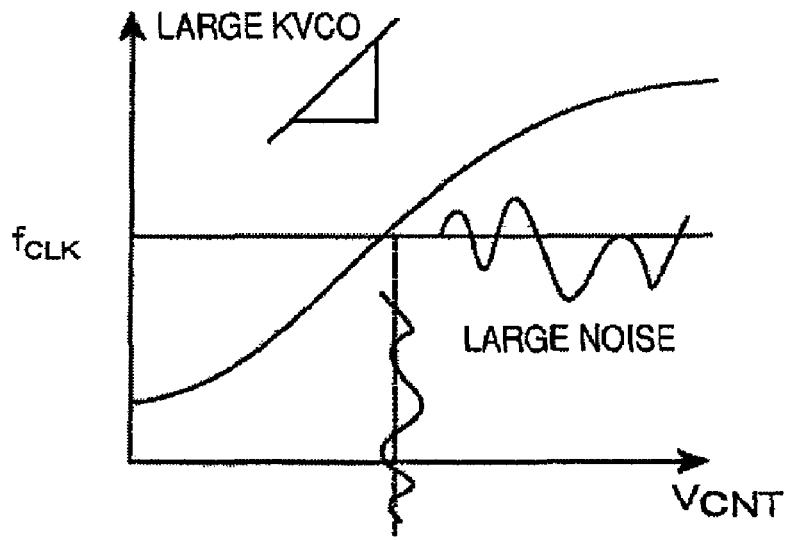
FIG. 24A shows relation between voltage-to-frequency conversion gain KVCO and phase noise and FIG. 24B shows relation between voltage-to-frequency conversion gain KVCO and phase noise.
Figure 24B:
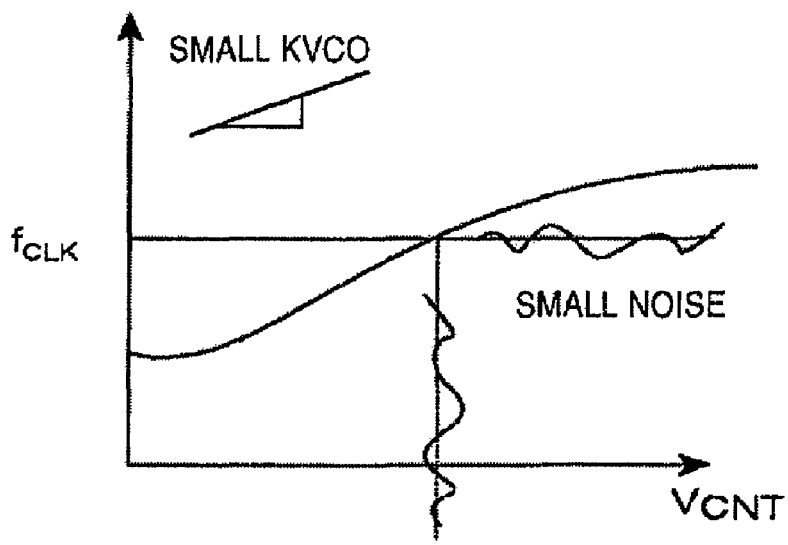

FIG. 5 shows relation among frequency control voltage VCNT, an output frequency f, the variation of temperature, process variation and the variation of supply voltage in the configuration of the embodiment of the invention. When there are the variation of temperature and process variation though conversion gain KVCO is small, a desired fixed output frequency can be initialized to a small control voltage range VAD-C. The control voltage range VAD-C is not only greatly small, compared with a control voltage range VAD-B shown in FIG. 23B when conversion gain KVCO is small but is also small, compared with a control voltage range VAD-A shown in FIG. 23A when conversion gain KVCO is large.

According to this embodiment of the invention, the variable frequency oscillator the frequency variation of which is small and the phase noise of which is small at the small voltage-to-frequency conversion ratio for the variation of temperature, dispersion among the MOS transistors and the variation of supply voltage can be realized by combining each function of the reference voltage source circuit 6, the reference voltage conversion circuit 7, the voltage conversion circuit for frequency control 8, the voltage select switch circuits 5 and the voltage controlled current source circuits 4.

The variable frequency oscillator equivalent to this embodiment can reduce the voltage-to-frequency conversion ratio and can reduce phase noise by suppressing frequency variation due to the variation of temperature, the variation of a threshold and process variation. Therefore, a high-precision high-frequency signal hardly including jitter can be generated in the internal circuits of LSI by configuring PLL using the variable frequency oscillator equivalent to this embodiment and the communication LSI for transmitting a high-speed signal of 1.0 GHz or more suitable for a serial transmission system can be manufactured at small power consumption and at a low cost.

Second Embodiment

Next, for a second embodiment of the invention, referring to FIGS. 6 to 8, an example of the practical configuration of a voltage-to-current conversion circuit 3 of a variable frequency oscillator 21 will be described.

The voltage-to-current conversion circuit 3 is provided with a reference voltage source circuit 30 corresponding to the reference voltage source circuit (REF1) 6, a reference voltage conversion circuit 31 corresponding to the reference voltage conversion circuit (REF2) 7, a voltage conversion circuit for frequency control 32 corresponding to the voltage conversion circuit for frequency control (CNV) 8, voltage select switch circuits 33, 34 corresponding to the first and second voltage select switch circuits 5 (5a, 5b) and voltage controlled current sources 35, 36 corresponding to the first and second voltage controlled current source circuits 4 (4a, 4b).

The reference voltage source circuit 30 is provided with MOS transistors 40 to 43 and a resistor 44 of a resistance value R and generates the same drain current I (=Vth/R) in the PMOS transistors 40, 41 so that the threshold voltage Vth of the NMOS transistor 42 and the voltage of the resistor R are equal. That is, the reference voltage source circuit 30 is configured by the first and second NMOS transistors 42, 43, the first and second PMOS transistors 40, 41 and the resistor 44, a source terminal of the first NMOS transistor 42 is connected to an ground terminal VSS, a gate terminal of the first NMOS transistor 42, a source terminal of the second NMOS transistor 43 and a first terminal of the resistor 44 are connected, a second terminal of the resistor 44 is connected to the ground terminal VSS, a drain terminal of the first NMOS transistor 42, a gate terminal of the second NMOS transistor 43 and a drain terminal of the first PMOS transistor 40 are connected, a gate terminal of the first PMOS transistor 40, a gate terminal and a drain terminal of the second PMOS transistor 41 and a drain terminal of the second NMOS transistor 43 are connected and connect with a reference voltage output terminal VREF1, a source terminal of the first PMOS transistor 40 and a source terminal of the second PMOS transistor 41 are connected to a power supply terminal VDD, and voltage depending upon the threshold voltage Vth of the first NMOS transistor 42 is supplied to the reference voltage output terminal VREF1.

Relation between the NMOS transistors and the PMOS transistors of the reference voltage source circuit 30 may be also reverse. In this case, the reference voltage source circuit 30 is configured by first and second NMOS transistors, first and second PMOS transistors and the resistor, a source terminal of the first PMOS transistor is connected to the power supply terminal VDD, a gate terminal of the first PMOS transistor, a source terminal of the second PMOS transistor and the first terminal of the resistor R are connected, the second terminal of the resistor is connected to the power supply terminal VDD, a drain terminal of the first PMOS transistor, a gate terminal of the second PMOS transistor and a drain terminal of the first NMOS transistor are connected, a gate terminal of the first NMOS transistor, a gate terminal and a drain terminal of the second NMOS transistor and a drain terminal of the second PMOS transistor are connected and connect with a reference voltage output terminal VREF1, a source terminal of the first NMOS transistor and a source terminal of the second NMOS transistor are connected to the ground terminal VSS, and voltage VREF1 depending upon the threshold voltage of the first PMOS transistor is supplied to the reference voltage output terminal.

The reference voltage conversion circuit 31 transposes the reference voltage of a current mirror from the gate voltage of PMOS 45 to the gate voltage of NMOS 46 and outputs reference voltage VOFFSET.

That is, the reference voltage conversion circuit 31 includes the PMOS transistor 45 and the NMOS transistor 46, a gate terminal of the PMOS transistor 45 functions as an input terminal of the reference voltage VREF1, a source terminal of the PMOS transistor 45 is connected to a power supply terminal VDD, a drain terminal of the PMOS transistor 45, a drain terminal and a gate terminal of the NMOS transistor 46 are connected and connect with a second reference voltage output terminal VREF2, a source terminal of the NMOS transistor 46 is connected to an ground terminal VSS, and output voltage according to the input reference voltage VREF1 is supplied.

Relation between the NMOS transistor and the PMOS transistor of the reference voltage conversion circuit 31 may be also reverse. In this case, the reference voltage conversion circuit 31 forming the voltage-to-current conversion circuit 3 is configured by an NMOS transistor and a PMOS transistor, a gate terminal of the NMOS transistor functions as an input terminal, a source terminal of the NMOS transistor is connected to the power supply terminal VDD, a drain terminal of the NMOS transistor, a drain terminal and a gate terminal of the PMOS transistor are connected and connect with a second reference voltage output terminal VREF2, a source terminal of the PMOS transistor is connected to the ground terminal VSS, and output voltage VOFFSET according to the input reference voltage VREF1 is supplied.

Next, in the voltage conversion circuit for frequency control 32, control voltage VCNT from an external device is input to a gate of a transistor 48 and an increasing rate of voltage is reduced by a resistor 49. Offset current depending upon temperature is generated by inputting the reference voltage VOFFSET to a gate of a transistor 50 and an offset VCNT is added to the gate voltage of a transistor 47.

That is, the voltage conversion circuit for frequency control 32 includes the first and second NMOS transistors 48, 50, the PMOS transistor 47 and the resistor 49, a control voltage input terminal VCNT is connected to the gate terminal of the first NMOS transistor 48, a source terminal of the first NMOS transistor 48 is connected to a first terminal of the resistor 49, a gate terminal of the second NMOS transistor 50 is connected to a reference voltage input terminal VREF2 (=VOFFSET), and a second terminal of the resistor 49 and a source terminal of the second NMOS transistor are connected to an ground terminal VSS. Drain terminals of the first and second NMOS transistors 48, 50, a drain terminal and a gate terminal of the PMOS transistor 47 are connected and connect with an output terminal VCNV, and a source terminal of the PMOS transistor 47 is connected to a power supply terminal VDD. The output voltage VCNV of the voltage conversion circuit for frequency control 32 depends upon the input control voltage VCNT and the input reference voltage VREF2.

Relation between the NMOS transistors and the PMOS transistor of the voltage conversion circuit for frequency control 32 may be also reverse. In this case, the voltage conversion circuit for frequency control 32 is configured by first and second PMOS transistors, an NMOS transistor and the resistor, the control voltage input terminal VCNT is connected to a gate terminal of the first PMOS transistor, a source terminal of the first PMOS transistor is connected to the first terminal of the resistor, a gate terminal of the second PMOS transistor is connected to the reference voltage input terminal VREF2, the second terminal of the resistor and a source terminal of the second PMOS transistor are connected to the power supply terminal VDD, drain terminals of the first and second PMOS transistors, a drain terminal and a gate terminal of the NMOS transistor are connected and connect with the output terminal VCNV, and a source terminal of the NMOS transistor is connected to the ground terminal VSS. The output voltage VCNV of the voltage conversion circuit for frequency control 32 depends upon the input control voltage VCNT and the input reference voltage VREF2.

Next, the voltage select switch circuits 33, 34 have the same circuit configuration and are different in input voltage and output voltage. A transistor 51a of the voltage select switch circuit 33 configures a current mirror together with the transistor 41 of the reference voltage source circuit 30, a transistor 51b of the voltage select switch circuit 34 configures a current mirror together with the transistor 47 of the voltage conversion circuit for frequency control 32, and the transistors produce drain current depending upon voltage.

For example, the voltage select switch circuit 33 includes first, second and third PMOS transistors 51a, 54a, 55a, first and second NMOS transistors 56a, 57a, n (integer) pieces of gate voltage select switch circuits 52a, 52b, 52c and n pieces of fourth PMOS transistors 53a, 53b, 53c, a voltage input terminal to which the reference voltage VREF1 is input, a gate terminal of the first PMOS transistor 51a and a voltage input terminal of the gate voltage select switch circuit are connected, source terminals of the first, second and fourth PMOS transistors 51a, 54a, 53a, 53b, 53c are connected to a power supply terminal VDD, and gate terminals of the fourth PMOS transistors 53a, 53b, 53c are connected to output terminals of the gate voltage select switch circuits 52a, 52b, 52c.

A gate terminal of the second PMOS transistor 54a, drain terminals of the first and fourth PMOS transistors 51a, 54a, 53a, 53b, 53c and a source terminal of the third PMOS transistor 55a are connected. Further, the drain terminal of the second PMOS transistor 54a, a gate terminal of the third PMOS transistor 55a and a drain terminal of the first NMOS transistor 56a are connected, and a drain terminal of the third PMOS transistor 55a, a drain terminal and a gate terminal of the second NMOS transistor 57a are connected. Further, a gate terminal of the first NMOS transistor 56a is connected to a second reference voltage input terminal VREF2 (=VOFFSET) and source terminals of the first and second NMOS transistors 56a, 57a are connected to each ground terminal VSS. Further, n pieces of logic signal input terminals Da1 to Dan are connected to logic input terminals of n pieces of gate voltage select switch circuits 52a, 52b, 52c and voltage VADJ acquired by multiplying input voltage by ratio depending upon the input voltage (the reference voltage VREF1, VOFFSET) and determined by the input logic signal DCNT (Da1 to Dan) is supplied to an output terminal (an input terminal of the voltage controlled current source 35).

Next, the gate voltage select switch circuits 52a, 52b, 52c, 52d, 52e, 52f can extend any gate size of the MOS transistors 51a, 51b by turning on/off the gate voltage of the MOS transistors 53a, 53b, 53c, 53d, 53e, 53f according to the logic signal (the control signal) DCNT. Normally, the gate size of the MOS transistors 53a, 53b, 53c complies with the ratio of the power of 2 and drain current can be varied at the gradations of the "n"th power of 2 by providing the n-bit input terminal.

The MOS transistors 54a and 54b, the MOS transistors 55a and 55b and the MOS transistors 56a and 56b configure a cascode current mirror for the MOS transistor 51a and the MOS transistors 53b, 53c, and the dependency upon supply voltage of each drain current of the MOS transistors 51a, 51b and the MOS transistors 53a, 53b, 53c, 53d, 53e, 53f is reduced. The MOS transistors 57a, 57b generate voltage VADJ, VFREQ depending upon each drain current and the voltage is applied to each gate terminal of the voltage controlled current sources 35, 36 respectively made of the MOS transistor.

In the voltage select switch circuits 33, 34, relation between the NMOS transistors and the PMOS transistors may be also reverse. In this case, the voltage select switch circuit is configured by first, second and third NMOS transistors, first and second PMOS transistors, m(integer) pieces of gate voltage select switch circuits and m pieces of fourth NMOS transistors. The voltage input terminal, a gate terminal of the first NMOS transistor and a voltage input terminal of the gate voltage select switch circuit are connected, source terminals of the first, second and fourth NMOS transistors are connected to the ground terminal, and a gate terminal of the fourth NMOS transistor is connected to an output terminal of the gate voltage select switch circuit. Further, a gate terminal of the second NMOS transistor, drain terminals of the first and fourth NMOS transistors and a source terminal of the third NMOS transistor are connected, and a drain terminal of the second NMOS transistor, a gate terminal of the third NMOS transistor and a drain terminal of the first PMOS transistor are connected. Further, a drain terminal of the third NMOS transistor, a drain terminal and a gate terminal of the second PMOS transistor are connected, and a gate terminal of the first PMOS transistor is connected to the second reference voltage input terminal. Further, source terminals of the first and second PMOS transistors are connected to each ground terminal and n pieces of logic signal input terminals are connected to logic input terminals of n pieces of gate voltage select switch circuits. Hereby, voltage depending upon input voltage and acquired by multiplying the input voltage by ratio determined by an input logic signal is supplied to the output terminal.

The voltage controlled current sources 35, 36 are respectively provided with a MOS transistor, respectively output drain current depending upon the input voltage VADJ or VFREQ, and output current ICNT added at a common terminal ICS.

For example, the voltage controlled current source 35 includes one NMOS transistor 35, a gate terminal of the NMOS transistor is connected to an input voltage terminal VADJ, a source terminal is connected to an ground terminal VSS, a drain terminal as an output current terminal is connected to the common terminal ICS, and current depending upon the input voltage VADJ is output.

The voltage controlled current sources 35, 36 may also respectively include a PMOS transistor. In this case, the voltage controlled current source is configured by one PMOS transistor, a gate terminal of the PMOS transistor is connected to the input voltage terminal, a source terminal is connected to a power supply terminal VDD, a drain terminal functions as an output current terminal, and current depending upon the input voltage VADJ or VFREQ is output.

Figure 6:
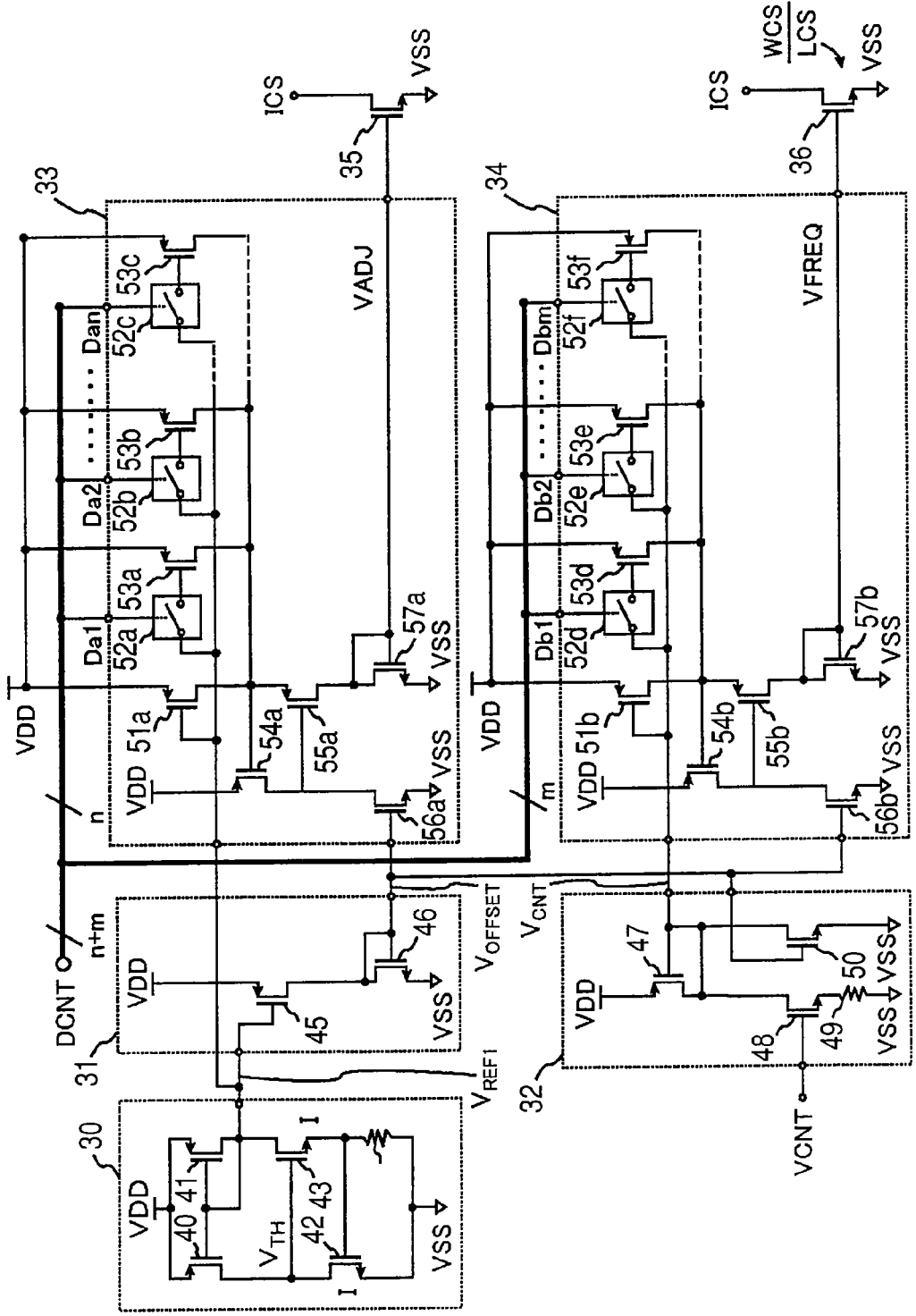
FIG. 6 is a block diagram showing an embodiment of a voltage-to-current conversion circuit used in the invention.

The variable frequency oscillator the frequency of which hardly varies even if temperature varies, the MOS transistors vary and supply voltage varies and the voltage-to-frequency conversion ratio of which is small can be realized by adopting the voltage-to-current conversion circuit 3 shown in FIG. 6 in the variable frequency oscillator 21 described in the first embodiment.

Figure 7:
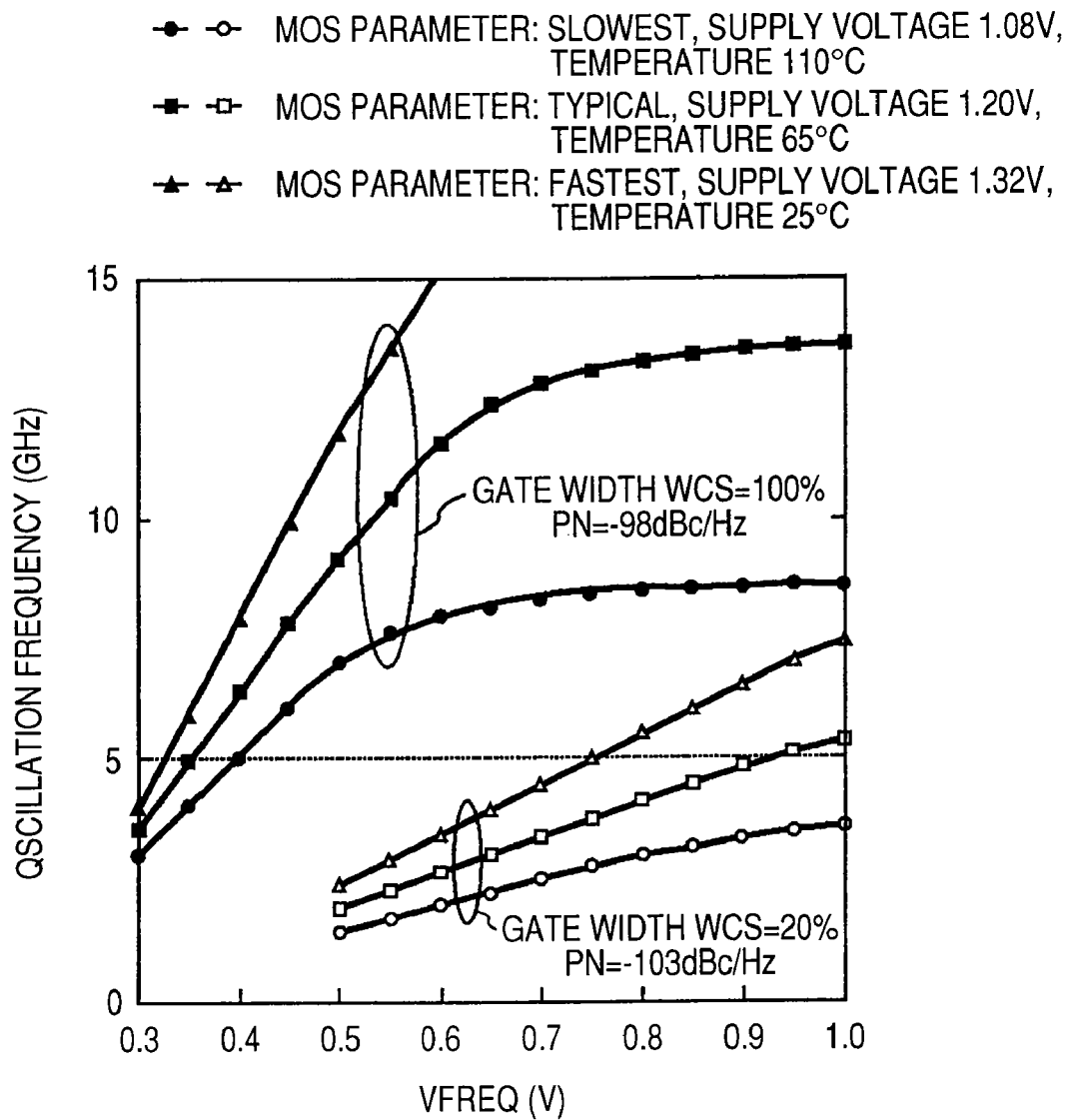
FIG. 7 is an explanatory drawing for explaining relation between control voltage and an oscillation frequency in relation to the effect of the embodiment shown in FIG. 6.
Figure 8:
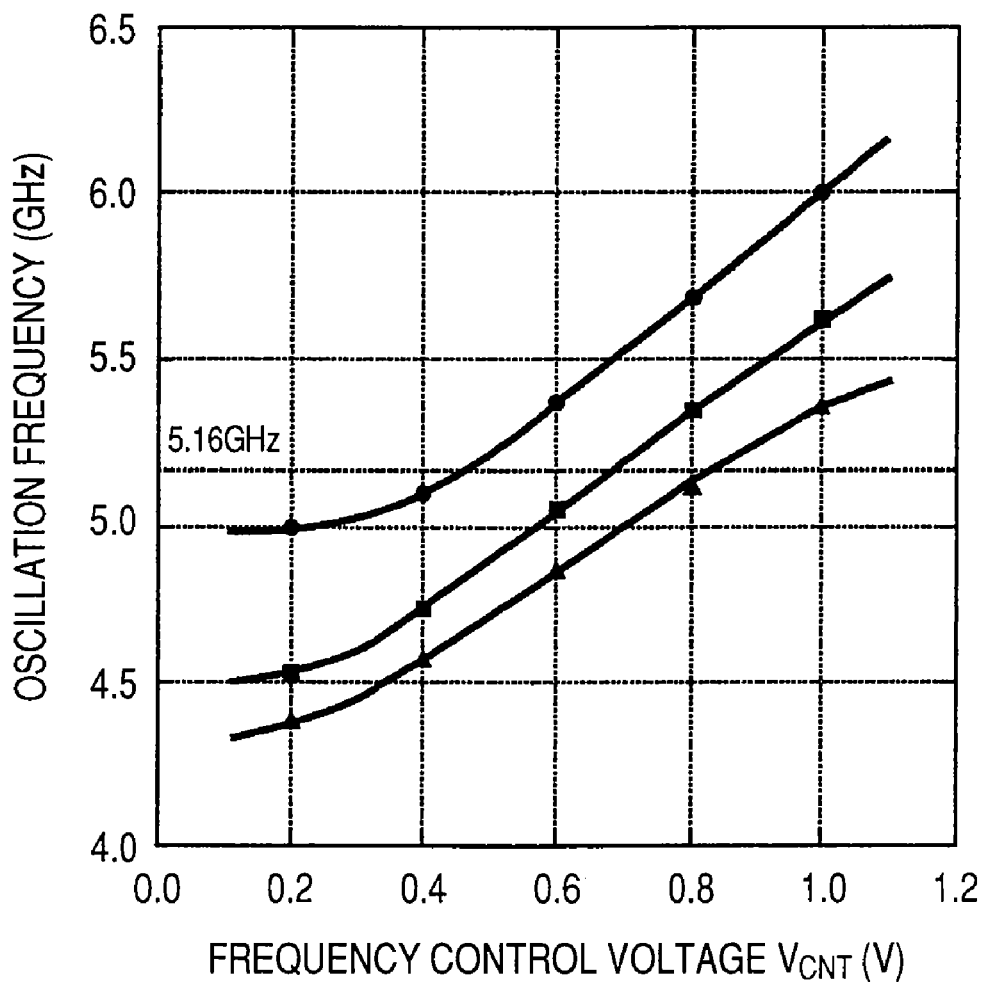
FIG. 8 is an explanatory drawing for explaining the effect of the embodiment shown in FIG. 6.

FIGS. 7 and 8 show the simulation result of a reproduced operational principle by circuit simulation using Spectre (trademark) developed by Cadence Corporation in which an oscillation frequency and phase noise can be acquired using periodic steady-state (PSS) analysis in relation to the variable frequency oscillator equivalent to this embodiment of the invention.

FIG. 7 shows relation between the dependency upon control voltage of an oscillation frequency and phase noise when voltage-to-frequency conversion ratio KVCO is varied. In this case, 5 GHz is a desired oscillation frequency fCLK. As for the voltage controlled current source in this embodiment shown in FIG. 6 as the voltage controlled current source circuit 4, a case that the gate width WCS of the transistor 36 is extended (=100%) is shown on the upside of FIG. 7 and a case that WCS is reduced up to 20% is shown on the downside of FIG. 7. Cases of three conditions, that is, a condition that the oscillation frequency is the most (supply voltage: 1.32 V, temperature: 25° C., MOS parameter: fastest), a condition that the oscillation frequency is the fewest (supply voltage: 1.08 V, temperature: 110° C., MOS parameter: slowest) and a standard condition (supply voltage: 1.20 V, temperature: 65° C., MOS parameter: standard speed) are respectively shown.

As shown on the upside of FIG. 7, when the gate width WCS is large, voltage-to-frequency conversion ratio KVCO is 20 to 40 GHz/V. At this time, the oscillation frequency fCLK also greatly varies depending upon the condition; however, as the variation width of the frequency is large, control voltage under which desired 5 GHz is acquired on any condition exists.

In the meantime, when the gate width WCS is small as shown on the downside of FIG. 7, KVCO is 3 to 10 GHz/V. At this time, the oscillation frequency also greatly varies depending upon the condition and in the case of the condition that the oscillation frequency is the fewest, no control voltage under which desired 5 GHz is acquired exists. Therefore, the oscillator of 5 GHz cannot be realized.

However, in comparison in phase noise, when WCS is small, that is, when KVCO is small, phase noise decreases up to −103 dBc/Hz at the time of the offset frequency of 1 MHz. When the phase noise is further reduced, it is further difficult to acquire a desired oscillation frequency fCLK.

Then, as a result of applying a suitable logic signal and suitable control voltage to the circuit configuration shown in FIG. 6, a satisfactory result shown in FIG. 8 is acquired. FIG. 8 also shows cases of three conditions as in FIG. 7. A desired oscillation frequency fCLK is calculated as 5.16 GHz.

FIG. 8 shows that control voltage that makes the oscillator oscillate 5.16 GHz exists on any condition. KVCO is approximately 1.3 GHz/V and phase noise is −87 dBc/Hz at the time of the offset frequency of 1 MHz.

The reason why phase noise decreases in FIG. 8, compared with FIG. 7 is that in FIG. 7, the increase of noise by connecting the reference voltage source circuit 6 is added to the result of calculation in FIG. 8. As effect that noise caused by a charge pump when the charge pump is included in the PLL is attenuated by the reduction of the voltage-to-frequency conversion ratio KVCO and jitter is reduced is added, a satisfactory characteristic for jitter can be acquired in FIG. 8 in which KVCO is 1/20 to 1/40.

As described above, according to this embodiment, the variable frequency oscillator the frequency variation of which for the variation of temperature, the process variation of MOS and the variation of supply voltage is small and the phase noise of which is small at low voltage-to-frequency conversion ratio can be realized by combining respective functions of the reference voltage source circuit 6, the reference voltage conversion circuit 7, the voltage conversion circuit for frequency control 8, the voltage select switch circuits 5 and voltage controlled current source circuits 4. Therefore, a high-precision high-frequency signal hardly having jitter can be generated in the internal circuit of LSI by configuring the PLL using the variable frequency oscillator in this embodiment and communication LSI for transmitting a high speed signal of 1.0 GHz or more suitable for a serial transmission system can be manufactured at small power consumption and at a low cost.

Third Embodiment

Figure 9:
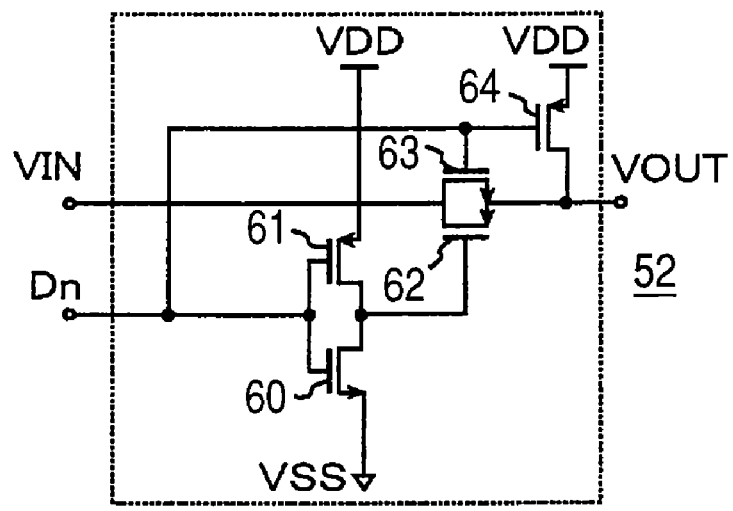
FIG. 9 is a circuit diagram showing an embodiment of a gate voltage select switch circuit used in the invention.

FIG. 9 is a circuit diagram showing a more practical embodiment of the gate voltage select switch circuit 52(*a* to *f*) shown in FIG. 6.

A gate voltage select switch circuit 52 includes first and second NMOS transistors 60, 63 and first, second and third PMOS transistors 61, 62, 64.

Gate terminals of the first and second NMOS transistors 60, 63, gate terminals of the first and third PMOS transistors 61, 64 and a logic input terminal Dn are connected. A drain terminal of the first NMOS transistor 60, a drain terminal of the first PMOS transistor 61 and a gate terminal of the second PMOS transistor 62 are connected, a source terminal of the first NMOS transistor 60 is connected to an ground terminal VSS, source terminals of the first and third PMOS transistors 61, 64 are connected to each power supply terminal VDD, and a drain terminal of the second NMOS transistor 63, a drain terminal of the second PMOS transistor 62 and an input voltage terminal VIN are connected. A source terminal of the second NMOS transistor 63, a source terminal of the second PMOS transistor 62 and a drain terminal of the third PMOS transistor 64 are connected and connect with an output terminal VOUT.

The gate voltage select switch circuit 52 configured as described above matches output voltage VOUT with input voltage VIN when an input logic signal Dn is at a high level and matches the output voltage VOUT with the voltage of the power supply terminal VDD (supply voltage) when the input logic signal Dn is at a low level.

That is, the MOS transistors 60, 61 function as an inverter and output an inverted signal of the input logic signal Dn. The PMOS transistors 62, 63 function as a pass transistor, when voltage at a low level (L) is applied to the gate 62 and when voltage at a high level (H) is applied to the gate 63, voltage input to the input voltage terminal VIN is output as the output VOUT of the gate voltage select switch circuit 52 through the pass transistors. In the meantime, when voltage at a high level (H) is applied to the gate 62 and when voltage at a low level (L) is applied to the gate 63, impedance increases between VIN and VOUT of the pass transistors, and as the gate of the PMOS transistor 64 is turned at a low level, VOUT of the gate voltage select switch circuit 52 becomes equal to VDD. Therefore, when the input logic signal Dn is at a high level and when VOUT=VIN and Dn is at a low level, VOUT is equal to VDD.

Owing to such configuration, the voltage select switch circuits 33, 34 shown in FIG. 6 can be realized.

In the gate voltage select switch circuit 52, relation between the NMOS transistors and the PMOS transistors may be also reverse. That is, the gate voltage select switch circuit is configured by first and second PMOS transistors and first, second and third NMOS transistors, and gate terminals of the first and second PMOS transistors, gate terminals of the first and third NMOS transistors and the logic input terminal Dn are connected. A drain terminal of the first PMOS transistor, a drain terminal of the first NMOS transistor and a gate terminal of the second NMOS transistor are connected, and a source terminal of the first PMOS transistor is connected to the ground terminal. Source terminals of the first and third NMOS transistors are connected to each power supply terminal VDD, and a drain terminal of the second PMOS transistor, a drain terminal of the second NMOS transistor and the input voltage terminal VIN are connected. Further, a source terminal of the second PMOS transistor, a source terminal of the second NMOS transistor and a drain terminal of the third NMOS transistor are connected and connect with the output terminal VOUT. This gate voltage select switch circuit matches output voltage VOUT with input voltage VIN when the input logic signal Dn is at a high level and matches output voltage VOUT with the voltage of the power supply terminal VDD (supply voltage) when the input logic signal Dn is at a low level.

Fourth Embodiment

Figure 10:
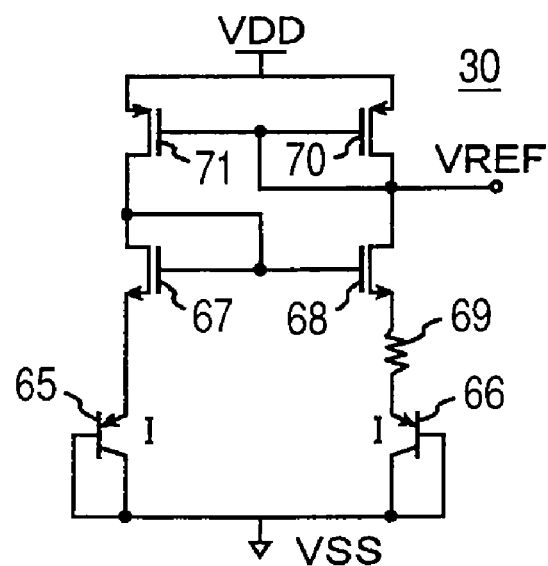
FIG. 10 is a circuit diagram showing an embodiment of a reference voltage source circuit used in the invention.

FIG. 10 is a circuit diagram showing another embodiment of the reference voltage source circuit 30. A reference voltage source circuit 30 is provided with bipolar transistors 65, 66, MOS transistors 67 to 71 and a resistor 69 of a resistance value R.

That is, gate terminals of the first and second PMOS transistors 70, 71, a drain terminal of the second PMOS transistor 71, a drain terminal of the second NMOS transistor 68 and an output voltage terminal VREF are connected. Source terminals of the first and second PMOS transistors 70, 71 are connected to a power supply terminal VDD, a drain terminal of the first NMOS transistor 67, gate terminals of the first and second NMOS transistors 67, 68 and a drain terminal of the first PMOS transistor 70 are connected, a source terminal of the first NMOS transistor 67 and an emitter terminal of the first pnp transistor 65 are connected, a source terminal of the second NMOS transistor 68 and a first terminal of the resistor 69 are connected, a second terminal of the resistor 69 and an emitter terminal of the second pnp transistor 66 are connected, and base terminals and collector terminals of the first and second pnp transistors 65, 66 are connected to an ground terminal VSS.

According to this configuration, voltage depending upon thermal voltage is output. That is, the emitter area of the bipolar (pnp) transistor 66 is equivalent to "n" times of the emitter area of the bipolar transistor 65 and bias current I (=VT×1n (n)/R) determined by the resistor 69 and thermal voltage (KP/Q) VT flows into the bipolar transistors 65, 66 and the MOS transistors 67, 68, 70, 71. Voltage depending upon thermal voltage VT is output from the output voltage terminal VREF of the reference voltage source circuit 30. As current that refers to thermal voltage not depending upon the process variation of MOS can be generated by using this circuit configuration, the precision of an oscillation frequency can be enhanced and temperature compensation for frequency variation can be strictly made.

Fifth Embodiment

Figure 11:
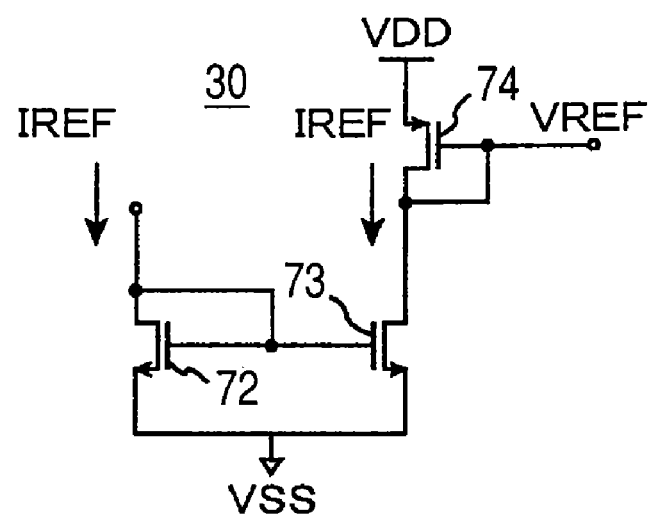
FIG. 11 is a circuit diagram showing another embodiment of the reference voltage source circuit used in the invention.

FIG. 11 is a circuit diagram showing further another embodiment of the reference voltage source circuit 30. A reference voltage source circuit 30 includes first and second NMOS transistors 72, 73 and one PMOS transistor 74. A gate terminal and a drain terminal of the first NMOS transistor 72 and a gate terminal of the second NMOS transistor 73 are connected and connect with an external input current terminal IREFF. Source terminals of the first and second NMOS transistors 72, 73 are connected to an ground terminal VSS, a drain terminal of the second NMOS transistor 73 and a gate terminal and a drain terminal of the PMOS transistor 74 are connected and connect with an output voltage terminal VREFF, and a source terminal of the PMOS transistor 74 is connected to a power supply terminal VDD. According to this reference voltage source circuit 30, output voltage VREFF is supplied depending upon external input current IREFF.

In the reference voltage source circuit 30, relation between the NMOS transistors and the PMOS transistor may be also reverse. That is, the reference voltage source circuit is configured by first and second PMOS transistors and an NMOS transistor, a gate terminal and a drain terminal of the first PMOS transistor and a gate terminal of the second PMOS transistor are connected and connect with the external input current terminal. Source terminals of the first and second PMOS transistors are connected to the power supply terminal, a drain terminal of the second PMOS transistor, a gate terminal and a drain terminal of the NMOS transistor are connected and connect with the output voltage terminal, and a source terminal of the NMOS transistor is connected to the power supply terminal. In the reference voltage source circuit, the output voltage VREFF is also supplied depending upon the external input current IREFF.

As internal current that refers to precise current IREF from an independent current source generated outside an oscillator can be generated by using the reference voltage source circuit described above, the precision of an oscillation frequency can be enhanced. The compensation of temperature, process variation and supply voltage for frequency variation can be controlled not only from the inside of the reference voltage source circuit but from an external device.

Sixth Embodiment

Figure 12:
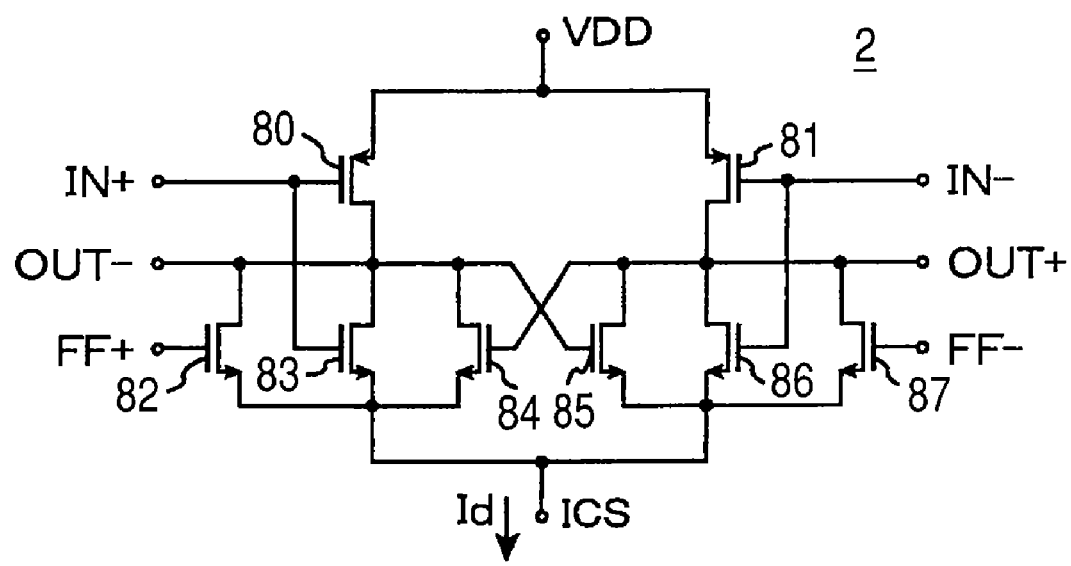
FIG. 12 is a circuit diagram showing an embodiment of a delay circuit used in the invention.

FIG. 12 is a circuit diagram showing a practical embodiment of each delay circuit 2 (2a to 2e) shown in FIG. 1. That is, a delay circuit forming a ring oscillator includes first to sixth NMOS transistors 82 to 86 and first and second PMOS transistors 80, 81. Source terminals of the first and second PMOS transistors 80, 81 are connected to a power supply terminal VDD, gate terminals of the first PMOS transistor 80 and the second NMOS transistor 83 are connected to a first differential positive phase input terminal IN+, and gate terminals of the second PMOS transistor 81 and the fifth NMOS transistor 86 are connected to a first differential negative phase input terminal IN−. A drain terminal of the first PMOS transistor 80, drain terminals of the first, second and third NMOS transistors 82, 83, 84 and a gate terminal of the fourth NMOS transistor 85 are connected to a differential negative phase output terminal OUT−.

A drain terminal of the second PMOS transistor 81, drain terminals of the fourth, fifth and sixth NMOS transistors 85, 86, 87 and a gate terminal of the third NMOS transistor 84 are connected to a differential positive phase output terminal OUT+. Source terminals of the first to sixth NMOS transistors 82 to 86 are connected to a current input terminal ICS, a gate terminal of the first NMOS transistor 82 is connected to a second differential positive phase input terminal FF+, and a gate terminal of the sixth NMOS transistor 87 is connected to a second differential negative phase input terminal FF−.

The PMOS transistor 80 and the NMOS transistor 83 configure a complementary amplifier circuit that amplifies a signal input to the input terminal IN+ and outputs the signal to the output terminal OUT−, and the PMOS transistor 81 and the NMOS transistor 86 configure a complementary amplifier circuit that amplifies a signal input to the input terminal IN− and outputs the signal to the output terminal OUT+. The NMOS transistors 84 and 85 configure a positive feedback circuit, amplify differential voltage between the output terminals OUT+ and OUT−, and increase the amplitude of output. Therefore, as the transistors can increase the amplitude of output even if an input signal is extremely small, the gain per stage of the delay circuits is increased and the stable operation of oscillation is enabled. The NMOS transistors 82 and 87 amplify a differential signal between differential input signals FF+, FF− and output it to OUT+, OUT−.

In this case, as signals input to the second differential positive phase input terminal FF+ and the second differential negative phase input terminal FF− are switched prior to signals input to the first differential positive phase input terminal IN+ and the first differential negative phase input terminal IN−, delay time is reduced, and a delay time since the switching of the input differential signal till the switching of an output differential signal varies depending upon input current ICS.

That is, the outputs of the delay circuits before the outputs of the delay circuits connected to IN+ and IN− by one stage are output to FF+, FF− so that leading edges of the signals input to FF+, FF− are immediately before leading edges of the signals input to IN+, IN−. Time required for the charge/discharge of load capacitance can be reduced by this operation, and the enhancement of an oscillation frequency and the reduction of phase noise are enabled.

Drain current Id is supplied to ICS to which the source terminals of the NMOS transistors 82, 83, 84, 85 are connected from a connected current source. Time tpd required for the charge/discharge of load capacitance CL in which the input capacitance, the output parasitic capacitance and the wiring parasitic capacitance of the transistor at the next stage connected to the output terminal are totalized is substantially equal to the delay time of the delay circuit, and when the amplitude is Vpp, tpd≈CL×Vpp/Id. An oscillation frequency f0 of the ring oscillator configured by cascade-connecting the delay circuits by N pieces is represented as f0=1/tpd/N≈Id/CL/Vpp/N.

Therefore, the delay time of the delay circuit can be controlled by the input current Id and the oscillation frequency of the ring oscillator can be controlled. Besides, the delay circuit which is operated at low voltage and the delay time of which is short can be configured by using this circuit configuration.

Seventh Embodiment

Figure 13:
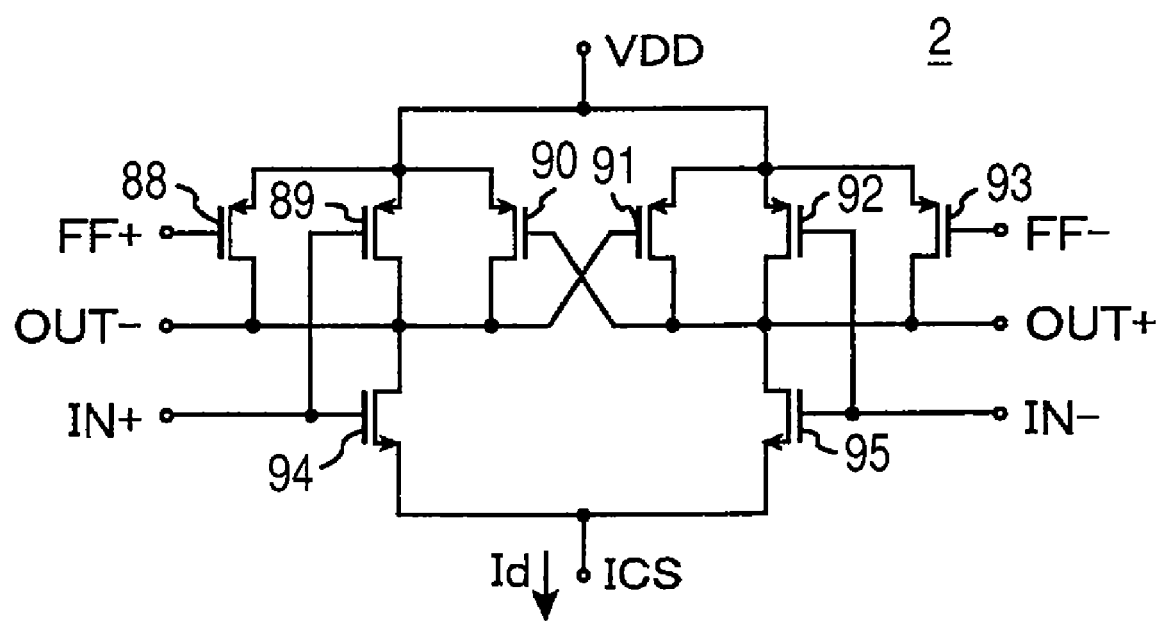
FIG. 13 is a circuit diagram showing another embodiment of the delay circuit used in the invention.

FIG. 13 is a circuit diagram showing another embodiment of each delay circuit 2 (2a to 2e) shown in FIG. 1. Compared with the circuit shown in FIG. 12, a circuit shown in FIG. 13 has circuit configuration in which the NMOS transistors and the PMOS transistors are inverted and its operational principle is the same as that of the sixth embodiment.

That is, the delay circuit 2 includes first to sixth PMOS transistors 88 to 93 and first and second NMOS transistors 94, 95. Source terminals of the first and second NMOS transistors 94, 95 are connected to a current input terminal ICS, gate terminals of the first NMOS transistor 94 and the second PMOS transistor 89 are connected to a first differential positive phase input terminal IN+, and gate terminals of the second NMOS transistor 95 and the fifth PMOS transistor 92 are connected to a first differential negative phase input terminal IN−. A drain terminal of the first NMOS transistor 94, drain terminals of the first, second and third PMOS transistors 88 to 90 and a gate terminal of the fourth PMOS transistor 91 are connected to a differential negative phase output terminal OUT−. A drain terminal of the second NMOS transistor 95, drain terminals of the fourth, fifth and sixth PMOS transistors 91 to 93 and a gate terminal of the third PMOS transistor 90 are connected to a differential positive phase output terminal OUT+. Source terminals of the first to sixth PMOS transistors 88 to 93 are connected to a power supply terminal VDD, a gate terminal of the first PMOS transistor 88 is connected to a second differential positive phase input terminal FF+, and a gate terminal of the sixth PMOS transistor 93 is connected to a second differential negative phase input terminal FF−.

As a signal input to the second differential signal input terminal is switched prior to a signal input to the first differential signal input terminal in this delay circuit 2, delay time is reduced and a delay time since the switching of an input differential signal till the switching of an output differential signal varies depending upon input current.

That is, as the transconductance gm of the PMOS transistor is smaller, compared with that of the NMOS transistor for the same gate size, the delay time is extended. In the meantime, as the transconductance gm of the PMOS transistor is smaller and its flicker noise is also smaller, its contribution to phase noise is smaller. As the delay time of the independently operated PMOS transistors 88, 89, 90, 91, 92, 93 has a larger effect on the delay time of the delay circuit than that of the NMOS transistors 94, 95 operated in common, a characteristic of the PMOS transistor has an effect on the delay circuit in the circuit shown in FIG. 13. Therefore, when the reduction of phase noise is more important than the enhancement of an oscillation frequency, the circuit configuration shown in FIG. 13 is preferable to that shown in FIG. 12. In this embodiment without feed forward, the operation is slow. Therefore, this circuit configuration is suitable for a case of a relatively low oscillation frequency of approximately 1.0 GHz.

Eighth Embodiment

Figure 14:
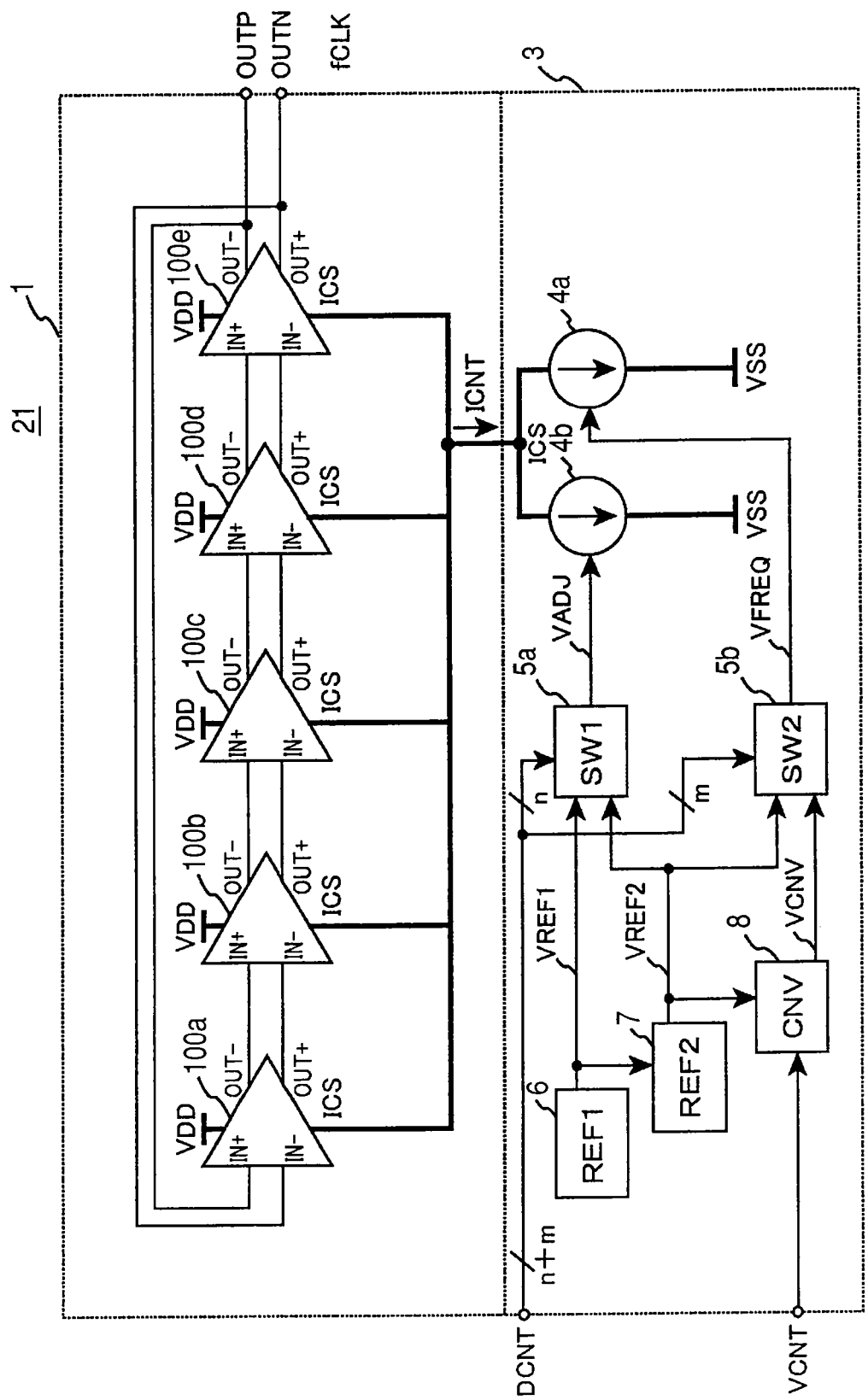
FIG. 14 is a block diagram showing a variable frequency oscillator equivalent to another embodiment of the invention.

FIG. 14 is a circuit diagram showing another embodiment of the variable frequency oscillator 21 according to the invention.

This embodiment is different from the embodiment shown in FIG. 1 in that a pair of differential signal input terminals and a pair of differential signal output terminals are provided to each current controlled delay circuit 100 (100a to 100e).

That is, a ring oscillator 1 of a variable frequency oscillator 21 includes delay circuits 100 of K stages (K: odd number of 3 or more) and each delay circuit is provided with differential signal input terminals (IN+, IN−), differential signal output terminals (OUT+, OUT−) and a current input terminal ICS. The differential signal output terminal of the delay circuit 100 at an M-th stage (M: integer of K−1 or less) is connected to the differential signal input terminal of the delay circuit 100 at an (M+1)-th stage with a positive phase and a negative phase inverted, and the differential signal output terminal of the delay circuit 100 at a K-th stage is connected to the first differential signal input terminal of the delay circuit at a first stage with a positive phase and a negative phase inverted. Or the ring oscillator may be also configured by the delay circuits 100 of L stages (L: even number of 2 or more), the delay circuit 100 is provided with differential signal input terminals (IN+, IN−), differential signal output terminals (OUT+, OUT−) and a current input terminal ICS, the differential signal output terminal of the delay circuit at an M-th stage (M: integer of L−1 or less) is connected to the differential signal input terminal of the delay circuit at an (M+1) stage with a positive phase and a negative phase inverted, and the differential signal output terminal of the delay circuit at an L-th stage is connected to the first differential signal input terminal of the delay circuit at a first stage as phases are.

An operational principle of this embodiment is the same as that in the first embodiment. However, the operation is slower than the operation of the circuit in the first embodiment. Therefore, this embodiment is suitable for a case of a relatively low oscillation frequency of approximately 1.0 GHz. This circuit configuration is simpler than the configuration of the first embodiment using two pairs of differential signal input/output terminals and gate size can be easily reduced. Therefore, when the reduction of area is more important than the enhancement of an oscillation frequency, the circuit configuration shown in FIG. 14 is preferable to that shown in FIG. 1.

Ninth Embodiment

Figure 15:
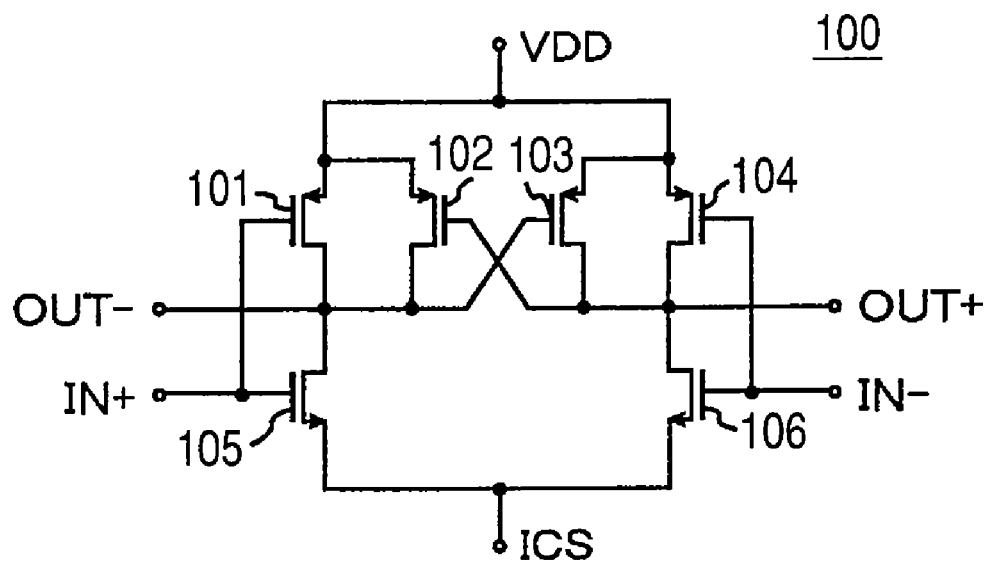
FIG. 15 is a circuit diagram showing further another embodiment of the delay circuit used in the invention.

FIG. 15 is a circuit diagram showing a practical another embodiment of each delay circuit 100 (100a to 100e) shown in FIG. 14.

A delay circuit 100 includes first to fourth PMOS transistors 101 to 104 and first and second NMOS transistors 105, 106. Source terminals of the first and second NMOS transistors 105, 106 are connected to a current input terminal ICS and gate terminals of the first NMOS transistor 105 and the first PMOS transistor 101 are connected to a differential positive phase input terminal IN+. Gate terminals of the second NMOS transistor 106 and the fourth PMOS transistor 104 are connected to a differential negative phase input terminal IN−, and a drain terminal of the first NMOS transistor 105, drain terminals of the first and second PMOS transistors 101, 102 and a gate terminal of the third PMOS transistor 103 are connected to a differential negative phase output terminal OUT−. A drain terminal of the second NMOS transistor 106, drain terminals of the third and fourth PMOS transistors 103, 104 and a gate terminal of the second PMOS transistor 102 are connected to a differential positive phase output terminal OUT+. Source terminals of the first to fourth PMOS transistors 101 to 104 are connected to a power supply terminal VDD.

According to this delay circuit 100, a delay time since the switching of an input differential signal till the switching of an output differential signal varies depending upon input current.

That is, the NMOS transistor 105 and the PMOS transistor 101 configure a complementary amplifier circuit that amplifies a signal input to the input terminal IN+ and outputs the signal to the output terminal OUT−, and the MOS transistors 106 and 104 configure a complementary amplifier circuit that amplifies a signal input to the input terminal IN− and outputs the signal to the output terminal OUT+. The PMOS transistors 102 and 103 configure a positive feedback circuit, amplify differential voltage between the output terminals OUT+ and OUT−, and increase output amplitude.

Therefore, as the output amplitude can be increased even if an input signal is extremely small, the gain per stage of the delay circuit is increased and the stable operation of oscillation is enabled. Drain current Id is supplied from a current source connected to ICS to which source terminals of the NMOS transistors 105 and 106 are connected. Time tpd required for the charge/discharge of load capacitance CL in which the input capacitance, the output parasitic capacitance and the wiring parasitic capacitance of the transistor at the next stage connected to the output terminal are totalized is substantially equal to the delay time of the delay circuit and when the amplitude is Vpp, tpd≈CL×Vpp/Id. An oscillation frequency f0 of the ring oscillator configured by cascade-connecting the delay circuits by N stages is represented as f0=1/tpd/N≈Id/CL/Vpp/N. Therefore, the delay time of the delay circuit can be controlled by the input current Id and the oscillation frequency of the ring oscillator can be controlled. Besides, the delay circuit which is operated at low voltage and the delay time of which is short can be configured by using this circuit configuration.

Tenth Embodiment

Figure 16:
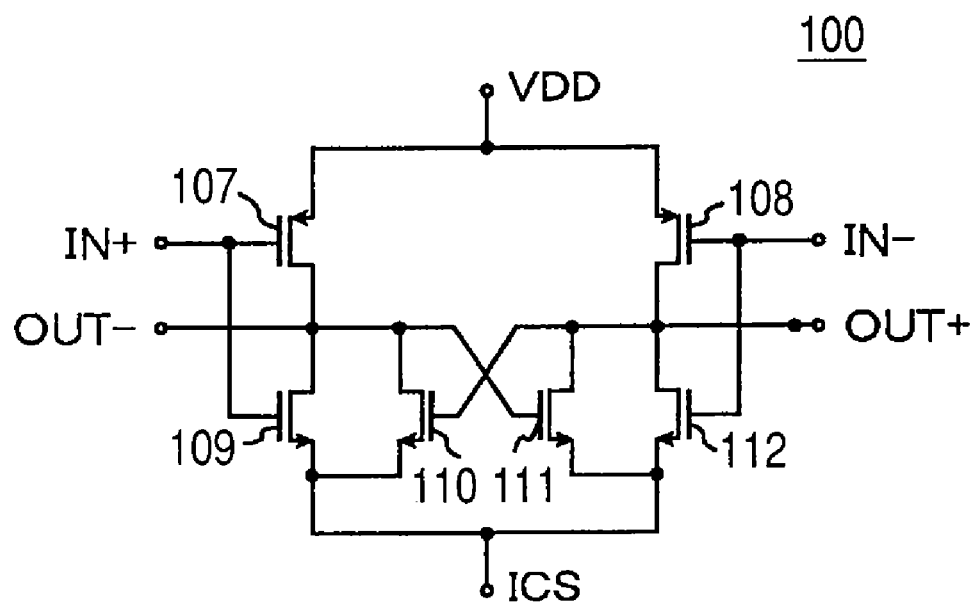
FIG. 16 is a circuit diagram showing furthermore another embodiment of the delay circuit used in the invention.

FIG. 16 is a circuit diagram showing another embodiment of each delay circuit 100 (100a to 100e) shown in FIG. 14. This embodiment is different from the circuit shown in FIG. 15 in circuit configuration in which NMOS transistors and PMOS transistors are inverted and its operational principle is the same as that in the ninth embodiment.

That is, a delay circuit 100 includes first to fourth NMOS transistors 109 to 112 and first and second PMOS transistors 107, 108. Source terminals of the first to fourth NMOS transistors 109 to 112 are connected to a current input terminal ICS and gate terminals of the first PMOS transistor 107 and the first NMOS transistor 109 are connected to a differential positive phase input terminal IN+. Gate terminals of the second PMOS transistor 108 and the fourth NMOS transistor 112 are connected to a differential negative phase input terminal IN−. A drain terminal of the first PMOS transistor 107, drain terminals of the first and second NMOS transistors 109, 110 and a gate terminal of the third NMOS transistor 111 are connected to a differential negative phase output terminal OUT−. A drain terminal of the second PMOS transistor 108, drain terminals of the third and fourth NMOS transistors 111, 112 and a gate terminal of the second NMOS transistor 110 are connected to a differential positive phase output terminal OUT+. Source terminals of the first and second PMOS transistors 107, 108 are connected to a power supply terminal VDD. According to this delay circuit 100, a delay time since the switching of an input differential signal till the switching of an output differential signal varies depending upon input current ICS.

That is, as the transconductance gm of the NMOS transistor is larger, compared with that of the PMOS transistor for the same gate size, delay time is reduced. In the meantime, as the transconductance gm of the NMOS transistor is larger than that of the PMOS transistor and the flicker noise is also larger, its contribution to phase noise is large. As the delay time of the independently operated NMOS transistors 109, 110, 111, 112 has a larger effect on the delay time of the delay circuit than the PMOS transistors 107, 108 operated in common, a characteristic of the NMOS transistor has an effect on the delay circuit shown in FIG. 16.

Therefore, when the enhancement of an oscillation frequency is more important than the reduction of phase noise, the circuit configuration of the embodiment shown in FIG. 16 is preferable to that of the embodiment shown in FIG. 15.

Eleventh Embodiment

Figure 17:
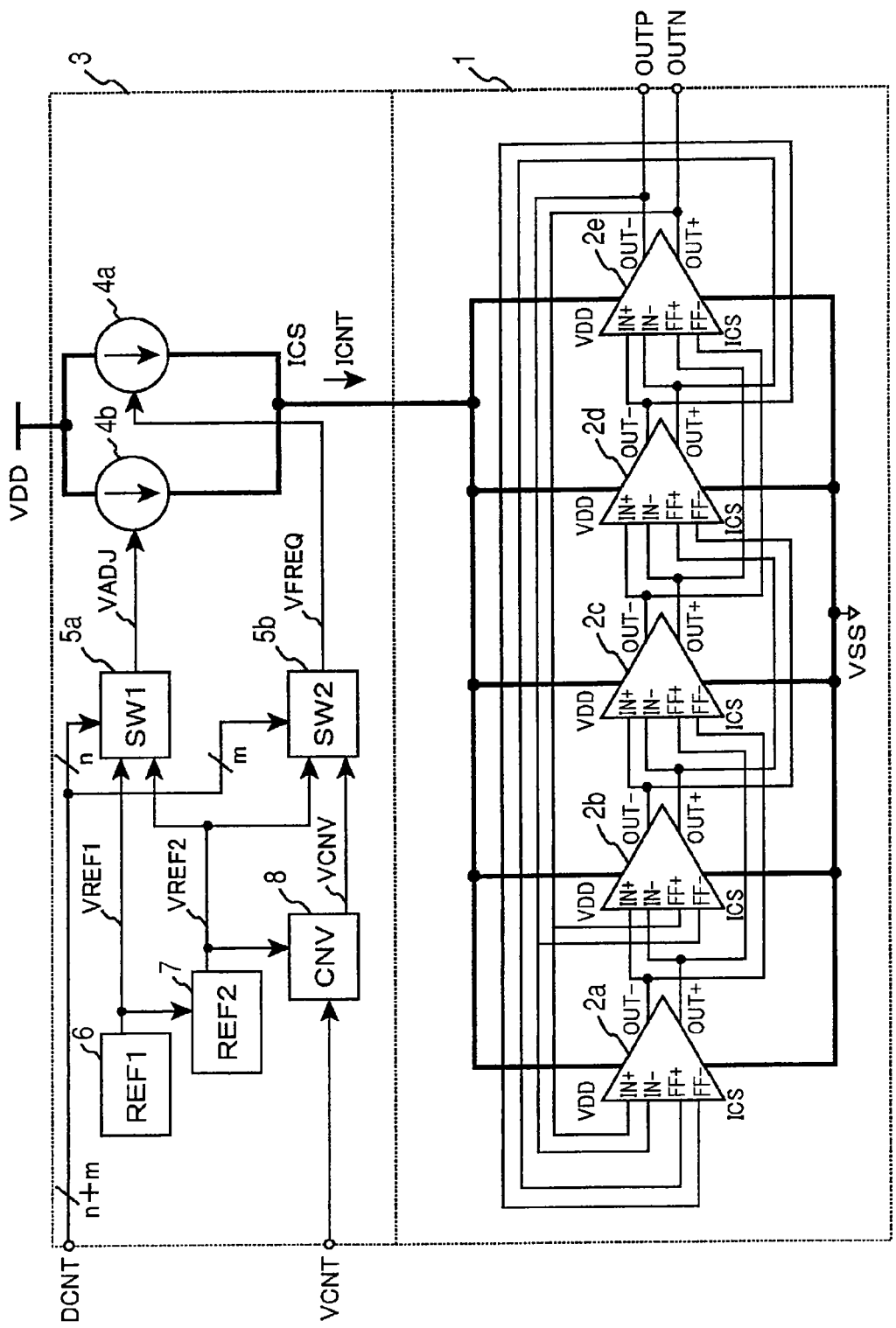
FIG. 17 is a block diagram showing a variable frequency oscillator equivalent to further another embodiment of the invention.

FIG. 17 is a circuit diagram showing further another embodiment of the variable frequency oscillator 21 according to the invention.

Differently from the case of FIG. 1, terminals of voltage controlled current sources 4a, 4b for connecting a current source to a ring oscillator 1 are connected to a power supply terminal VDD. In the meantime, an ICS terminal is connected to a ground terminal VSS. The voltage controlled current sources 4a, 4b are connected so that current ICNT flows from the power supply terminal VDD into the ring oscillator 1. The voltage controlled current sources 4a, 4b used in this embodiment are normally configured by a PMOS transistor. Therefore, in the case of the same gate size, flicker noise can be reduced, compared with a case that the current sources are configured by an NMOS transistor.

In the meantime, as the transconductance gm of the PMOS transistor is smaller, compared with that of the case that the current sources are configured by the NMOS transistor, output resistance increases when voltage between the drain and the source is lower than threshold voltage and drain current output resistance increases. Therefore, there is a defect that when supply voltage is decreased, control current ICNT decreases and an oscillation frequency decreases. Thereby, when the reduction of noise is more important than the reduction of supply voltage, the circuit configuration shown in FIG. 17 is desirable.

Twelfth Embodiment

Figure 18:
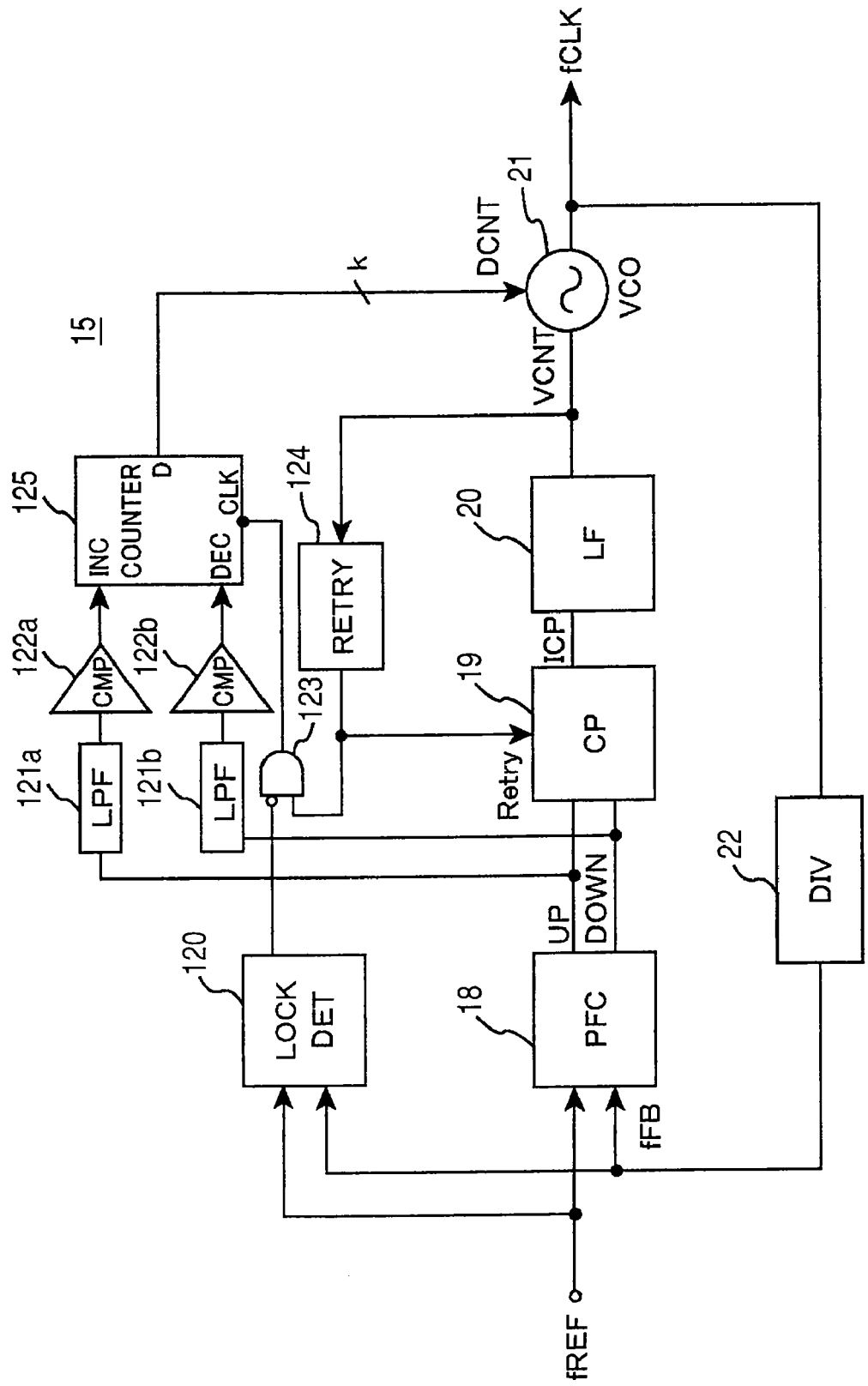
FIG. 18 is a block diagram showing another embodiment of PLL using the variable frequency oscillator according to the invention.

FIG. 18 is a circuit diagram showing another embodiment of the PLL 15 using the variable frequency oscillator 21 according to the invention. A lock detector 120 is a circuit that detects a state in which PLL 15 is locked for a reference clock signal and outputs a logic signal at a high level (H) when the PLL is locked. A retry circuit 124 is a circuit that outputs a signal for retrying because the PLL cannot be locked for the reference clock signal at an upper limit or a lower limit of an oscillation frequency range of VCO 21. An AND circuit 123 outputs a signal at a high level when the signal for retrying is output in an unlocked state. When the signal for retrying is output, a phase frequency detector 18 uses low-pass filters 121a, 121b and comparators 122a, 122b to detect which of an up signal or a down signal is mainly output.

When a phase is greatly off and the PLL is not locked, only either of the up signal or the down signal is output from the phase frequency detector 18.

DC volts are generated by the low-pass filters 121a, 121b and are identified by the comparators 122a, 122b. The identified up signal and down signal are input to a counter 125. In the case of the up signal, an output value of the counter 125 is increased. In the case of the down signal, a value of the counter 125 is decreased. Normally, a value of the counter is increased/decreased by 1, however, an increased/decreased value is not limited to 1.

A value DCNT of the counter is input to a logic input terminal of the variable frequency oscillator 21 according to the invention. As control current ICNT can be increased or decreased by logic input, phases are compared in another frequency range by sweeping control voltage VCNT since a logic signal is varied and the PLL can be locked at a certain value of the counter. The PLL operated in a large frequency range and almost free of jitter can be realized by configuring the PLL as described above without increasing voltage-to-frequency conversion ratio.

The variable frequency oscillator according to the invention is not limited to the PLLs having the configurations shown in FIGS. 2 and 18 and can be used for various PLLs.

Thirteenth Embodiment

Figure 19A:
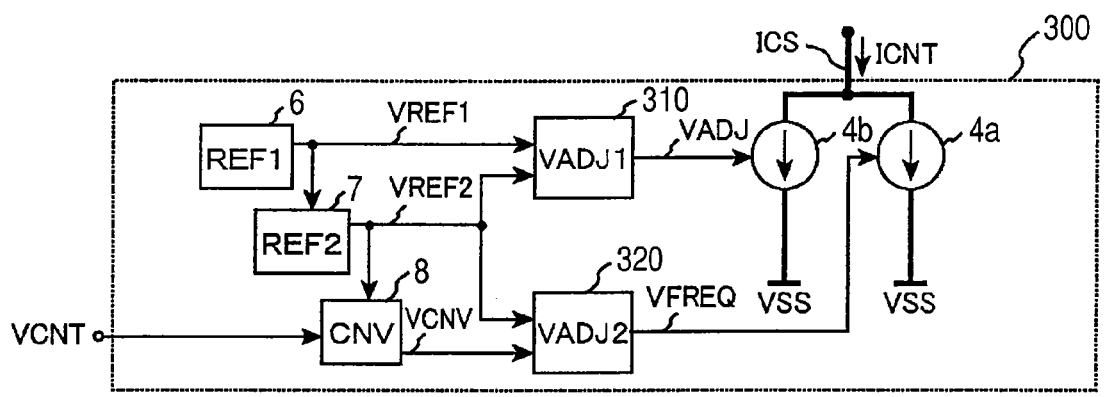
FIG. 19A is a block diagram showing a voltage-to-current conversion circuit equivalent to another embodiment of the invention.
Figure 19B:
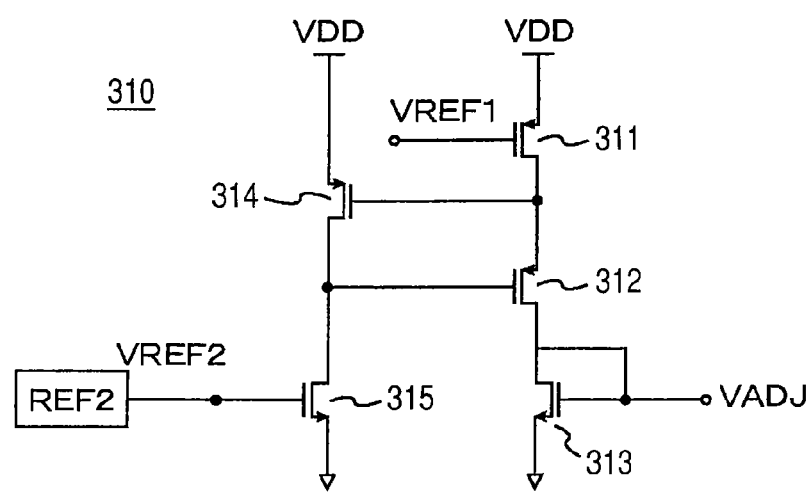
FIG. 19B is a circuit diagram showing the configuration of a first voltage adjuster in the embodiment shown in FIG. 19A.

Referring to FIGS. 19A and 19B, a voltage-to-current conversion circuit equivalent to another embodiment of the invention will be described below. FIG. 19A shows the voltage-to-current conversion circuit 300 in place of the voltage-to-current conversion circuit 3 shown in FIG. 1. The voltage-to-current conversion circuit 300 includes a voltage controlled current source circuits 4a, 4b, a first voltage adjuster 310, a second voltage adjuster 320, a reference voltage source circuit (REF1) 6, a reference voltage conversion circuit (REF2) 7 and a voltage conversion circuit for frequency control (CNV) 8. A terminal ICS common to the two voltage controlled current source circuits 4 and each terminal ICS of plural current controlled delay circuits 2 are connected. Frequency control voltage VCNT input from an external device is turned voltage VFREQ via the voltage conversion circuit for frequency control 8 controlled by a control signal DCNT and the second voltage adjuster 320 and is converted to current in the voltage controlled current source circuit 4a. In the meantime, each output of the reference voltage source circuit 6 controlled by the control signal DCNT, the reference voltage conversion circuit 7 and the voltage conversion circuit for frequency control 8 is turned output voltage VADJ via the first voltage adjuster 310 and is converted to current in the voltage controlled current source circuit 4b.

Two currents are added at a common terminal ICS of the voltage controlled current source circuit 4a and the voltage controlled current source circuit 4b and is output from the voltage-to-current conversion circuit 3 as control current ICNT.

FIG. 19B shows the configuration of the first voltage adjuster 310 shown in FIG. 19A. The first voltage adjuster 310 is provided with MOS transistors 311 to 315. VREF1 is input to a gate terminal of the MOS transistor 311 and VREF2 is input to a gate terminal of the MOS transistor 315. The output voltage VADJ of a reference voltage source circuit 30 is output as voltage dependent upon thermal voltage VT.

In this embodiment, compared with the above-mentioned embodiments, the configuration is simple because no switch is used, however, this embodiment is not suitable for a case in which process variation and others are large.

Fourteenth Embodiment

Figure 20:
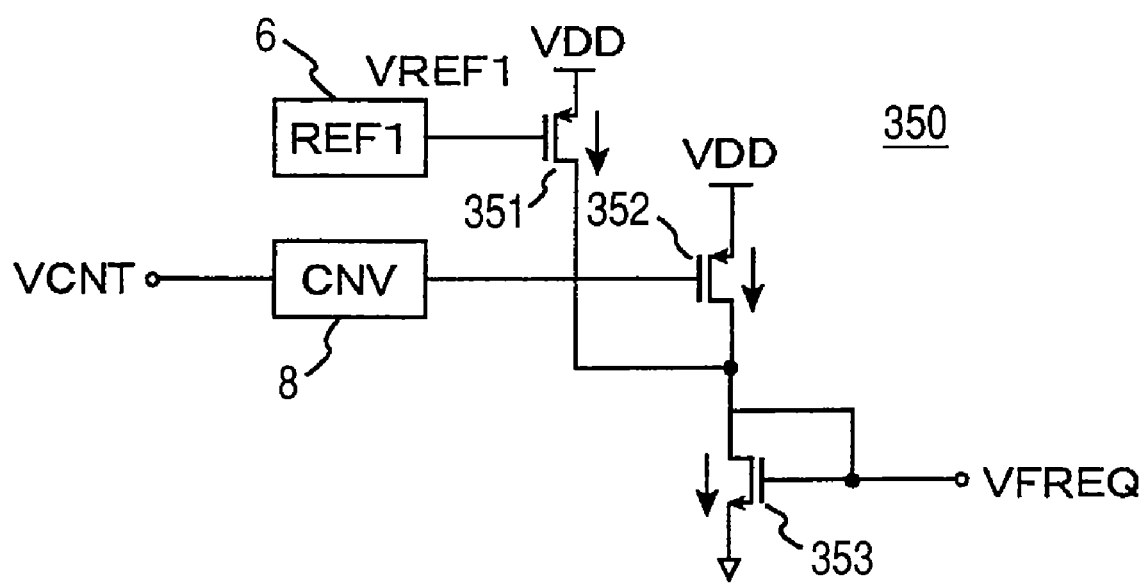
FIG. 20 is a circuit diagram showing the configuration of a second voltage adjuster in the embodiment shown in FIG. 19A.
Figure 21:
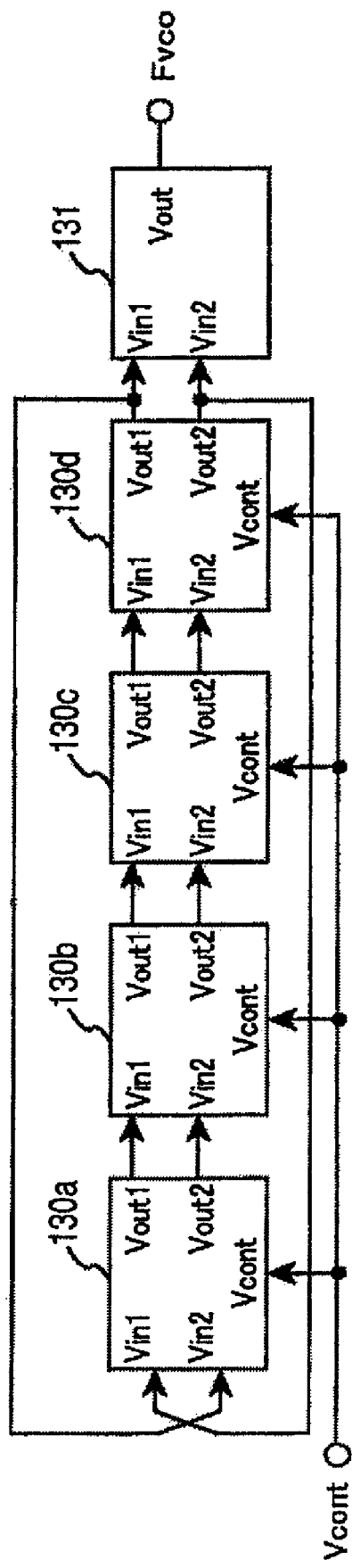
FIG. 21 is a block diagram showing a variable frequency oscillator in the related art.
Figure 22:
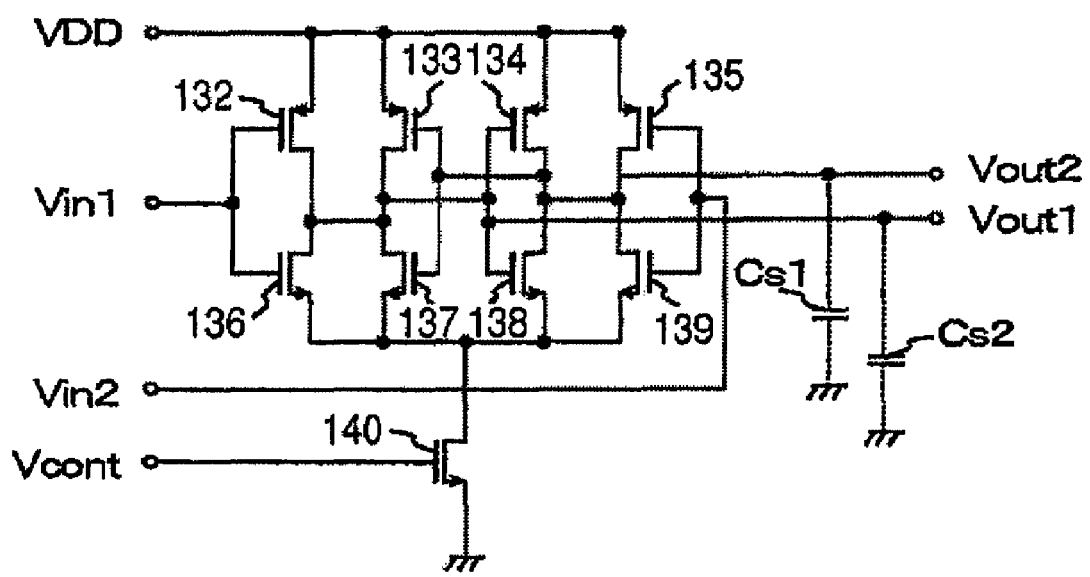
FIG. 22 is a circuit diagram showing a delay circuit in the related art.

Referring to FIG. 20, a voltage-to-current conversion circuit equivalent to another embodiment of the invention will be described below. FIG. 20 shows the voltage-to-current conversion circuit 350 in place of the voltage-to-current conversion circuit 3 shown in FIG. 1. The voltage-to-current conversion circuit 350 is provided with MOS transistors 351 to 353. Output voltage VFREQ in which the variation of ambient temperature and process variation are compensated is acquired by applying external control voltage VCNT to a gate of the transistor 352 and applying reference voltage VREF1 to a gate of the transistor 351. According to this embodiment, consumed current can be reduced. Compared with the above-mentioned embodiment, the configuration is simple because no switch is used, however, this embodiment is not suitable for a case in which process variation is large.

Figure 3:
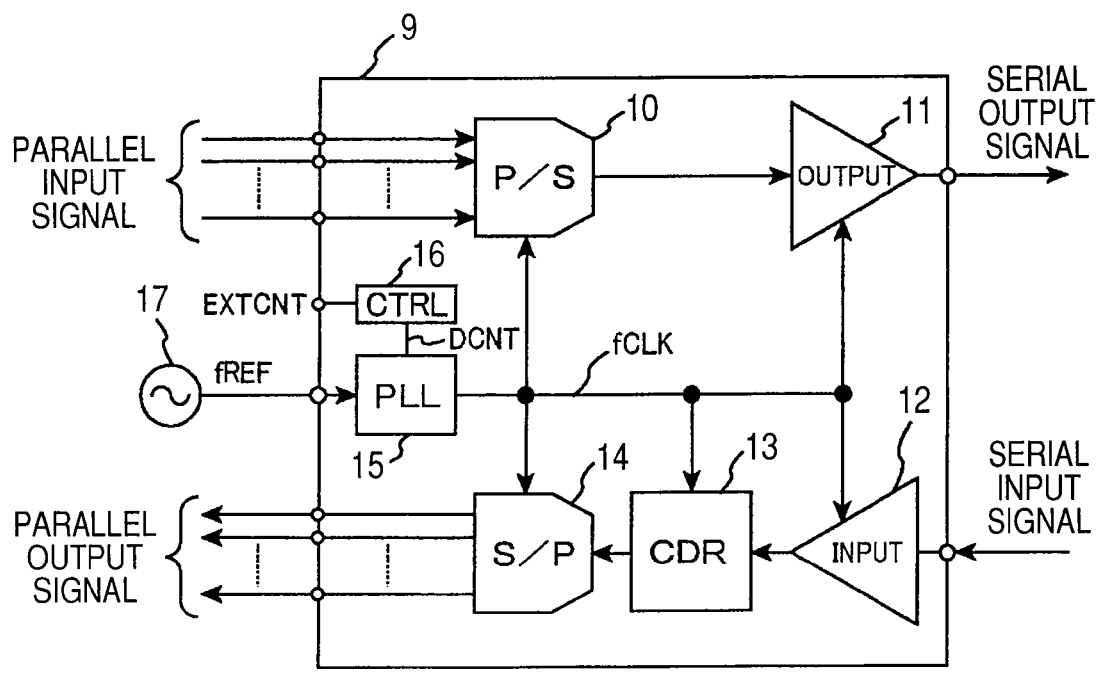
FIG. 3 is a circuit diagram showing an embodiment of a communication circuit using the variable frequency oscillator according to the invention.

In the above-mentioned each embodiment, the communication circuit to which the invention is applied is not limited to the SERDES shown in FIG. 3 as the example, can be used for various serial transmission communication circuits, various parallel transmission communication circuits and microprocessors, and further, can be also utilized for a reference frequency source circuit of a radio communication circuit and others.

According to each embodiment of the invention, the variable frequency oscillator that oscillates a stable frequency almost free of frequency variation can be configured inside a general semiconductor device for a digital circuit and a higher speed transmission communication system can be manufactured at a low cost.

What is claimed is:

1. A variable frequency oscillator, comprising:
a power supply terminal for connection to an external power supply;
a ring oscillator having delay circuits arranged in a plurality of stages, the delay circuits being cascade-connected in a ring, and each of the delay circuits being connected to the power supply terminal in common, the ring oscillator outputting an oscillation signal of a frequency based on a control current; and
a current source for frequency control connected to each of the delay circuits in common to supply the control current to the ring oscillator,
wherein the current source for frequency control includes a first current source and a second current source connected to the ring oscillator via a common terminal,
wherein the first current source generates current for frequency control based on an input frequency control voltage,
wherein the second current source generates current for compensation based on an environmental variation,
wherein the current for frequency control and the current for compensation are added to provide the control current for the ring oscillator,
wherein the second current source includes a reference voltage source circuit, a reference voltage conversion circuit, a first voltage select switch circuit, and a second voltage controlled current source circuit, and
wherein the first voltage select switch circuit includes a plurality of MOS transistors which are controlled by a portion of an input logic signal to vary an effective gate size of the first voltage select switch circuit, the first voltage select switch circuit multiplying input voltages from the reference voltage source circuit and the reference voltage conversion circuit and outputting the multiplied input voltages to the second voltage controlled current source circuit.

2. A variable frequency oscillator, comprising:
a power supply terminal for connection to an external power supply;
a ring oscillator having delay circuits arranged in a plurality of stages, the delay circuits being cascade-connected in a ring, and each of the delay circuits being connected to the power supply terminal in common, the ring oscillator outputting an oscillation signal of a frequency based on a control current; and
a current source for frequency control connected to each of the delay circuits in common to supply the control current to the ring oscillator,
wherein the current source for frequency control includes a first current source and a second current source connected to the ring oscillator via a common terminal,
wherein the first current source generates current for frequency control based on an input frequency control voltage,
wherein the second current source generates current for compensation based on an environmental variation,
wherein the current for frequency control and the current for compensation are added to provide the control current for the ring oscillator,
wherein the first current source includes a voltage conversion circuit for frequency control, a second voltage select switch circuit, and a second voltage controlled current source circuit, wherein the second current source generates a second reference voltage based on an output of a reference voltage source circuit for process, voltage and temperature environment compensation and offset voltage for process, the voltage and temperature environment compensation being provided based on the output of the reference voltage source circuit and converts the second reference voltage to a second current, wherein the voltage conversion circuit for frequency control converts a frequency control voltage input from an external device to a first reference output voltage based on the offset voltage, and wherein the second voltage select switch circuit includes a plurality of MOS transistors which are controlled by a portion of an input logic signal to vary an effective of gate size the second voltage select switch circuit, the second voltage select switch circuit multiplying the first reference output voltage and outputting the multiplied first reference output voltage to the second voltage controlled current source circuit.

3. A variable frequency oscillator, comprising:

a power supply terminal for connection to an external power supply;

a ring oscillator having delay circuits arranged in a plurality of stages, the delay circuits being cascade-connected in a ring, and each of the delay circuits being connected to the power supply terminal in common, the ring oscillator outputting an oscillation signal of a frequency based on a control current; and a current source for frequency control connected to each of the delay circuits in common to supply the control current to the ring oscillator, wherein the current source for frequency control includes a first current source and a second current source connected to the ring oscillator via a common terminal, wherein the first current source includes a voltage conversion circuit for frequency control and a first voltage controlled current source circuit, wherein the second current source includes a first reference voltage source circuit for process, voltage and temperature environment compensation, a second reference voltage conversion circuit for process, voltage and temperature environment compensation and a second voltage controlled current source circuit, wherein current of the first current source and current of the second current source are added, with the sum being input to the ring oscillator as the control current, wherein the current source for frequency control of the ring oscillator is provided with first and second voltage controlled current source circuits, first and second voltage selectors controlled by a control signal input from an external device, a reference voltage source circuit for process, voltage and temperature environment compensation, a reference voltage conversion circuit for process, voltage and temperature environment compensation and a voltage conversion circuit for frequency control to which voltage for frequency control input from an external device is input, wherein a terminal common to the first and second voltage controlled current source circuits and each terminal of the plurality of delay circuits are connected, wherein a control signal input from the external device is converted to first current control voltage via the second voltage selector and the first current control voltage is converted to first current in the first voltage controlled current source circuit, wherein each output of the reference voltage source circuit and the reference voltage conversion circuit respectively controlled by the control signal is converted to second current control voltage via the first voltage selector and the second current control voltage is converted to second current in the second voltage controlled current source circuit, and wherein the first and second currents are added to be current for frequency control of the ring oscillator.

4. The variable frequency oscillator according to claim 3, wherein the first and second voltage selectors are respectively provided with a switch configured by a MOS transistor, and each current control voltage is varied by an internal or external logic signal.

5. The variable frequency oscillator according to claim 3, wherein the reference voltage source circuit includes first and second NMOS transistors, first and second PMOS transistors, and a resistor, wherein a source terminal of the first NMOS transistor is connected to a ground terminal, wherein a gate terminal of the first NMOS transistor, a source terminal of the second NMOS transistor, and a first terminal of the resistor are connected and a second terminal of the resistor is connected to the ground terminal, wherein a drain terminal of the first NMOS transistor, a gate terminal of the second NMOS transistor, and a drain terminal of the first PMOS transistor are connected, wherein a gate terminal of the first PMOS transistor, a gate terminal and a drain terminal of the second PMOS transistor, and a drain terminal of the second NMOS transistor are connected and configure a reference voltage output terminal, wherein a source terminal of the first PMOS transistor and a source terminal of the second PMOS transistor are connected to a power supply terminal, and wherein voltage dependent upon the threshold voltage of the first NMOS transistor is supplied to the reference voltage output terminal.

6. A variable frequency oscillator, comprising:

a power supply terminal for connection to an external power supply;

a ring oscillator having delay circuits arranged in a plurality of stages, the delay circuits being cascade-connected in a ring, and each of the delay circuits being connected to the power supply terminal in common, the ring oscillator outputting an oscillation signal of a frequency based on a control current; and a current source for frequency control connected to each of the delay circuits in common to supply the control current to the ring oscillator, wherein the current source for frequency control includes a first current source and a second current source connected to the ring oscillator via a common terminal, wherein the first current source includes a voltage conversion circuit for frequency control and a first voltage controlled current source circuit, wherein the second current source includes a first reference voltage source circuit for process, voltage and temperature environment compensation, a second reference voltage conversion circuit for process, voltage and temperature environment compensation and a second voltage controlled current source circuit, wherein current of the first current source and current of the second current source are added, with the sum being input to the ring oscillator as the control current, and wherein the variable frequency oscillator further comprises:
a reference voltage source circuit for process, voltage and temperature environment compensation that generates one or more reference voltages dependent upon either of temperature or supply voltage;
a reference voltage conversion circuit for process, voltage and temperature environment compensation that increases and decreases voltage based on the input reference voltage;
a voltage conversion circuit for frequency control that increases and decreases input control voltage based on the reference voltage and for output thereof;
first and second voltage selectors that gradually switch the ratio of input voltage and output voltage by one or more input logic signals; and
first and second variable current sources that generate control current based on the input voltage,
wherein an output terminal of the reference voltage source circuit is connected to an input terminal of the first voltage selector,
wherein an output terminal of the first voltage selector is connected to an input terminal of the first variable current source,
wherein the output terminal of the reference voltage source circuit is connected to an input terminal of the reference voltage conversion circuit,
wherein an output terminal of the reference voltage conversion circuit is connected to a reference voltage input terminal of the voltage conversion circuit for frequency control,
wherein voltage input to the variable frequency oscillator functions as input control voltage of the voltage conversion circuit for frequency control,
wherein an output terminal of the voltage conversion circuit for frequency control is connected to an input terminal of the second voltage selector,
wherein an output terminal of the voltage selector is connected to an input terminal of the second variable current source,
wherein an output terminal of the first and second variable current sources is shared, and
wherein current acquired by adding respective output currents of the first and second variable current sources is used for the input control current of the ring oscillator.

* * * * *